United States Patent
Cook et al.

(10) Patent No.: US 11,869,864 B2
(45) Date of Patent: *Jan. 9, 2024

(54) NANOWIRES PLATED ON NANOPARTICLES

(71) Applicant: Texas Instruments Incorporated, Dallas, TX (US)

(72) Inventors: Benjamin Stassen Cook, Los Gatos, CA (US); Ralf Muenster, Saratoga, CA (US); Sreenivasan Kalyani Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/679,087

(22) Filed: Feb. 24, 2022

(65) Prior Publication Data
US 2022/0189903 A1 Jun. 16, 2022

Related U.S. Application Data

(63) Continuation of application No. 16/843,559, filed on Apr. 8, 2020, now Pat. No. 11,282,807.

(60) Provisional application No. 62/830,944, filed on Apr. 8, 2019, provisional application No. 62/830,989, filed on Apr. 8, 2019, provisional application No. 62/831,000, filed on Apr. 8, 2019, provisional application No. 62/831,016, filed on Apr. 8, 2019, provisional application No. 62/831,065, filed on Apr. 8, 2019.

(51) Int. Cl.
*H01L 23/00* (2006.01)
*H01L 23/367* (2006.01)
*H01L 23/15* (2006.01)
*H01L 23/495* (2006.01)
*H01L 23/373* (2006.01)

(52) U.S. Cl.
CPC .............. *H01L 24/29* (2013.01); *H01L 23/15* (2013.01); *H01L 23/3677* (2013.01); *H01L 23/3735* (2013.01); *H01L 23/4951* (2013.01); *H01L 23/49541* (2013.01); *H01L 24/27* (2013.01); *H01L 24/32* (2013.01); *H01L 24/48* (2013.01); *H01L 24/73* (2013.01); *H01L 2224/2746* (2013.01); *H01L 2224/29082* (2013.01); *H01L 2224/29344* (2013.01); *H01L 2224/29366* (2013.01); *H01L 2224/29499* (2013.01); *H01L 2224/32225* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2924/2064* (2013.01)

(58) Field of Classification Search
CPC ......... H01L 24/29; H01L 24/27; H01L 24/32; H01L 23/15; H01L 23/142; H01L 23/145; H01L 23/147; H01L 23/3677; H01L 23/3735; H01L 23/4951; H01L 23/49541
USPC ....................................................... 257/675
See application file for complete search history.

(56) References Cited

U.S. PATENT DOCUMENTS

| 11,282,807 B2 * | 3/2022 | Cook ..................... H01L 24/16 |
| 2015/0171046 A1 | 6/2015 | Zhang |

(Continued)

*Primary Examiner* — Jasmine J Clark
(74) *Attorney, Agent, or Firm* — Ronald O. Neerings; Frank D. Cimino

(57) ABSTRACT

In some examples, a system comprises a set of nanoparticles and a set of nanowires extending from the set of nanoparticles.

28 Claims, 25 Drawing Sheets

(56) References Cited

U.S. PATENT DOCUMENTS

2019/0010622 A1\* 1/2019 Yang .................. C25B 1/55
2019/0341328 A1 11/2019 Miline et al.

\* cited by examiner

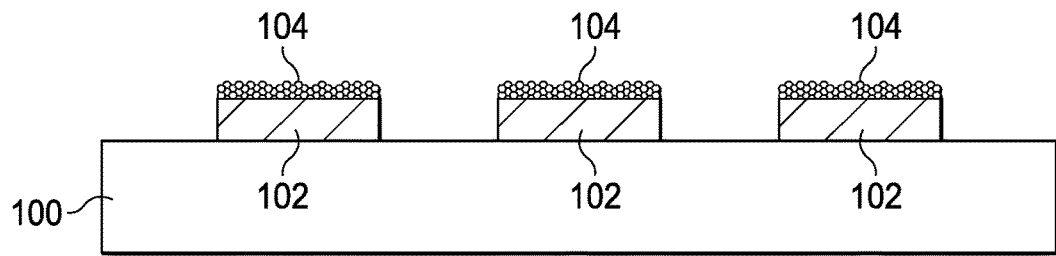
FIG. 1A1
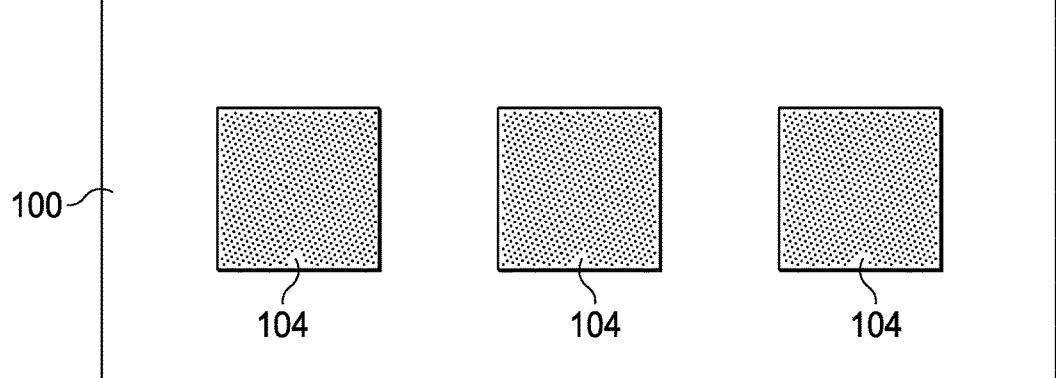
FIG. 1A2
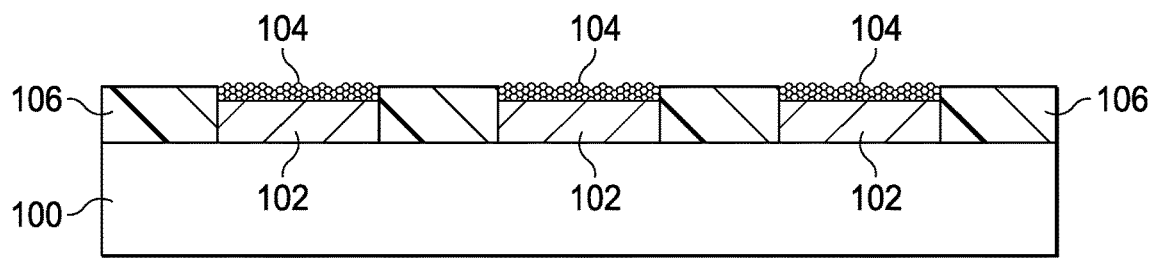
FIG. 1B1
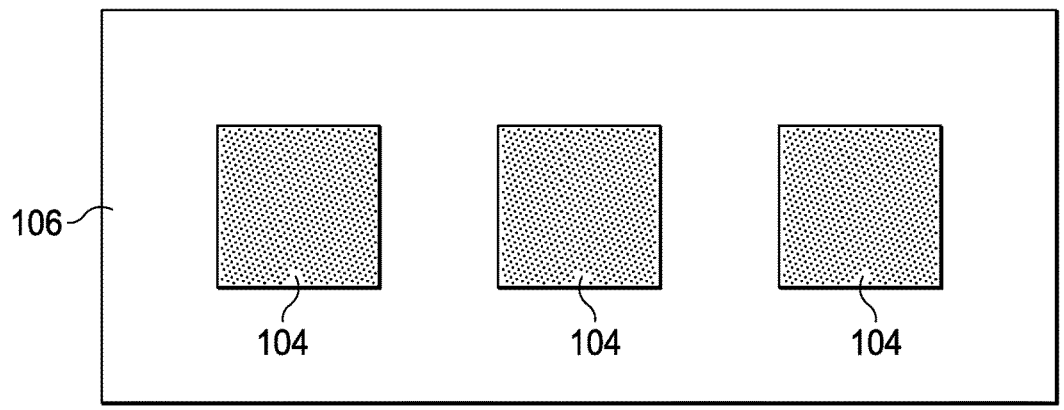
FIG. 1B2

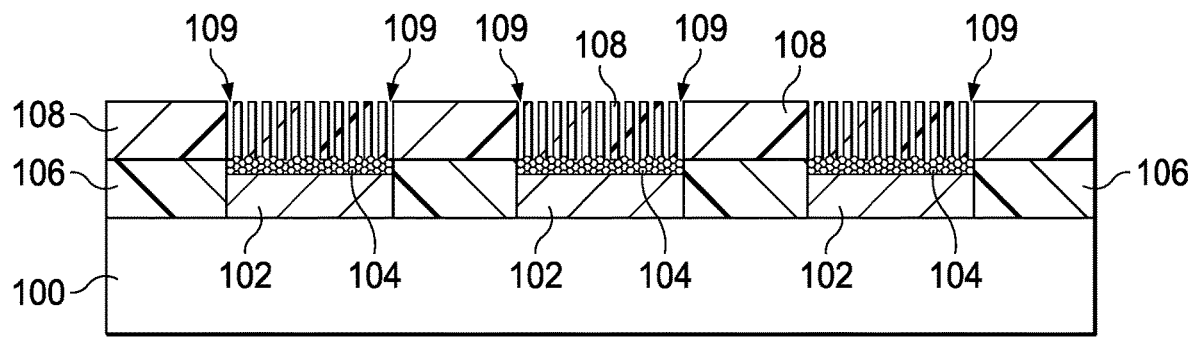
FIG. 1C1
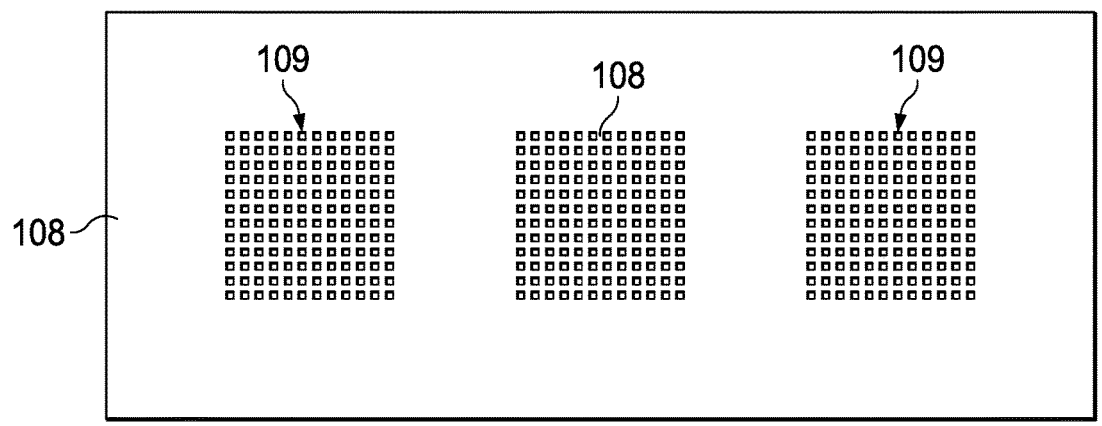
FIG. 1C2
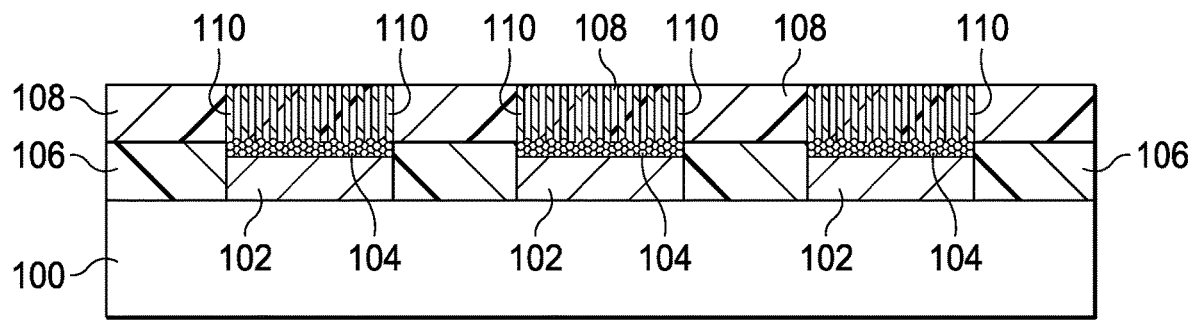
FIG. 1D1

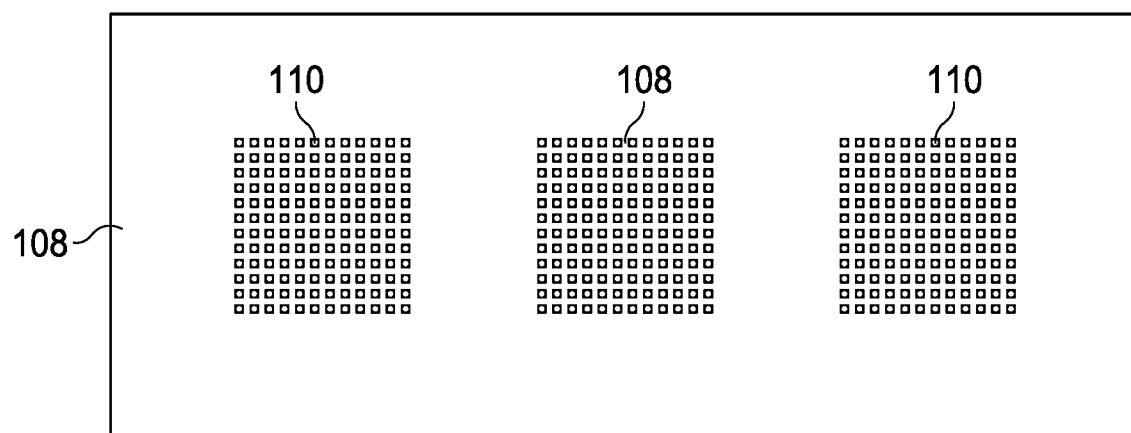
FIG. 1D2
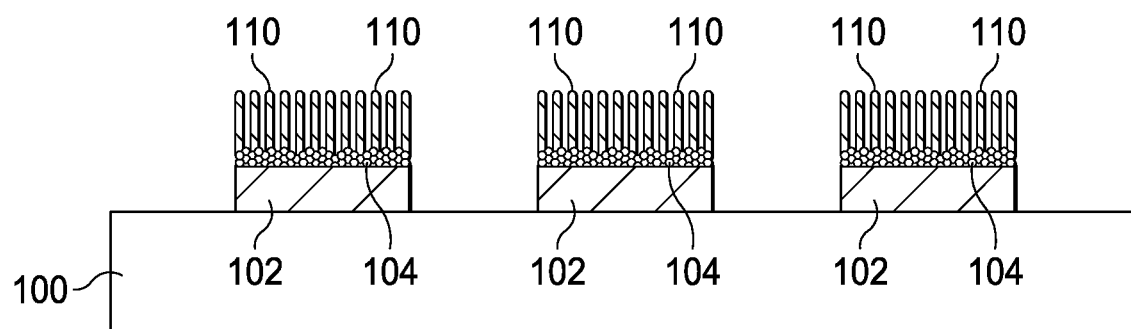
FIG. 1E1
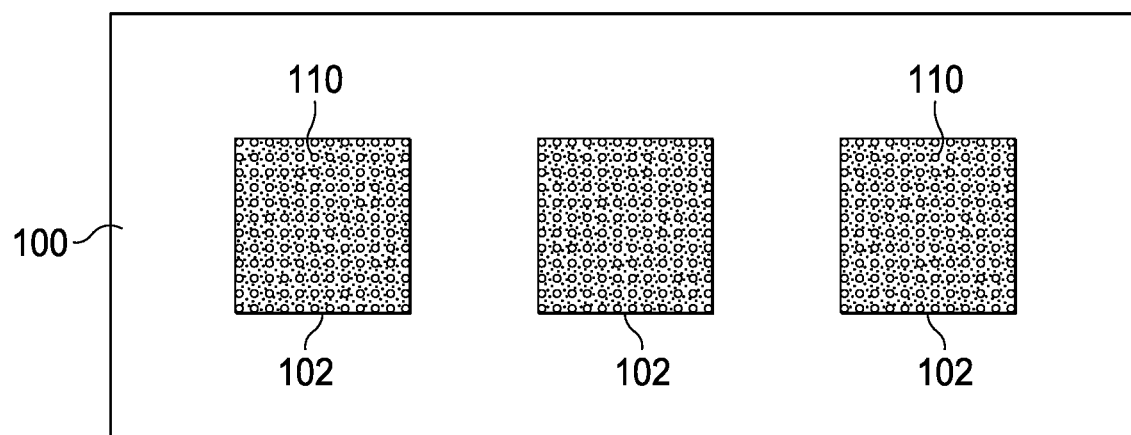
FIG. 1E2

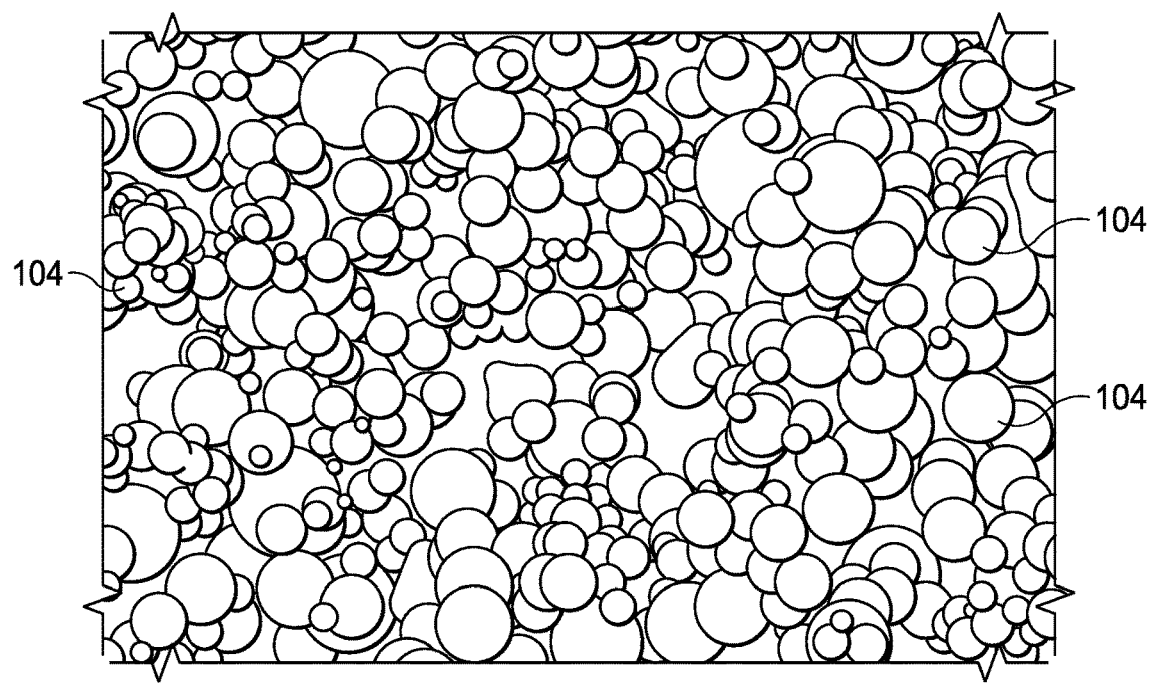
FIG. 2
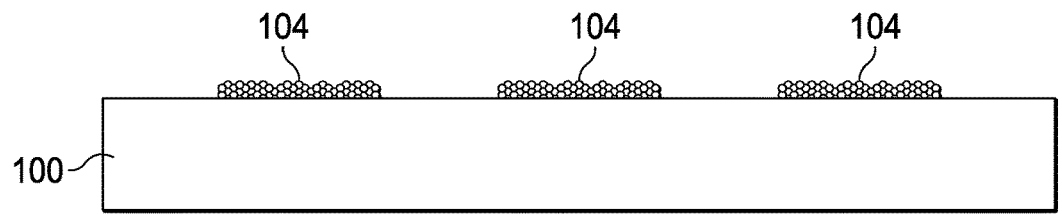
FIG. 3A1
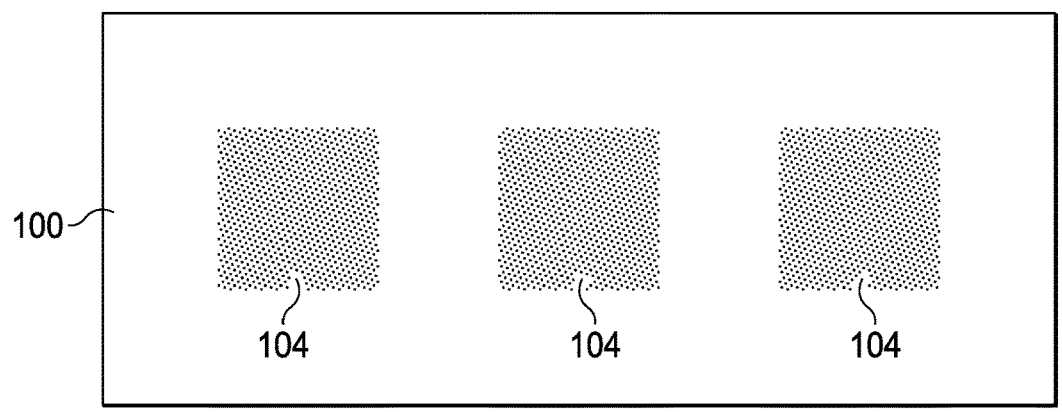
FIG. 3A2

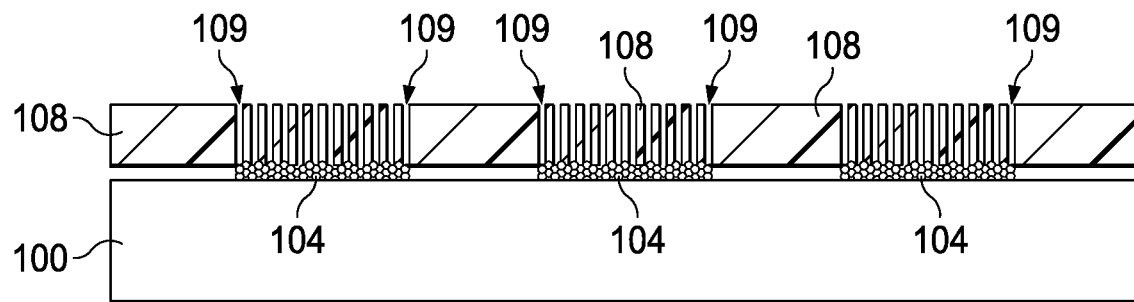
FIG. 3B1
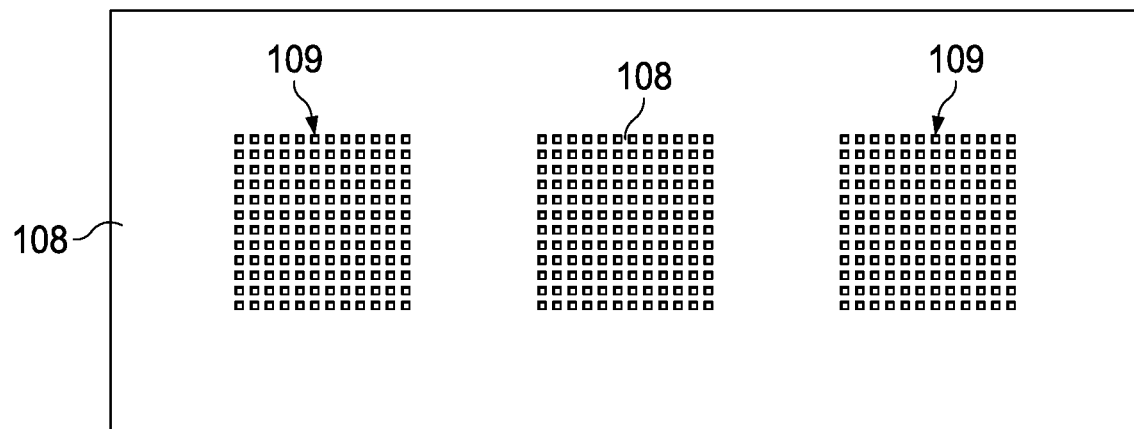
FIG. 3B2
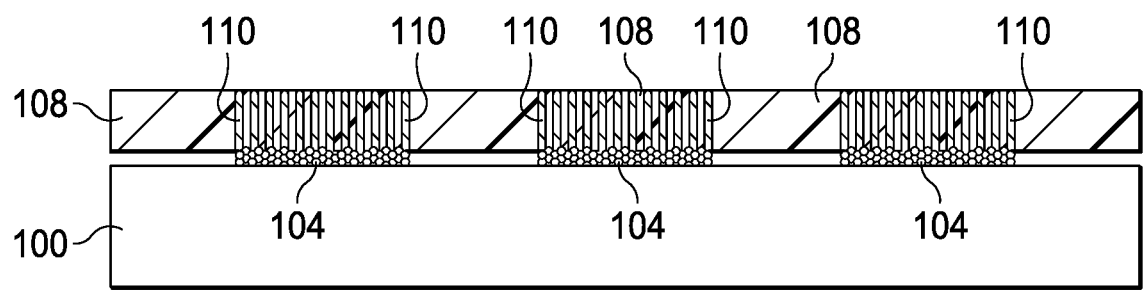
FIG. 3C1

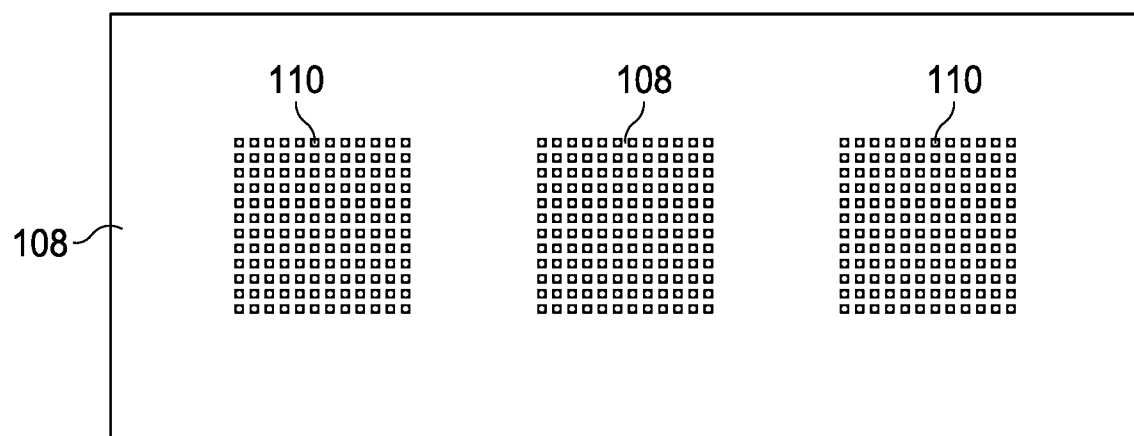
FIG. 3C2
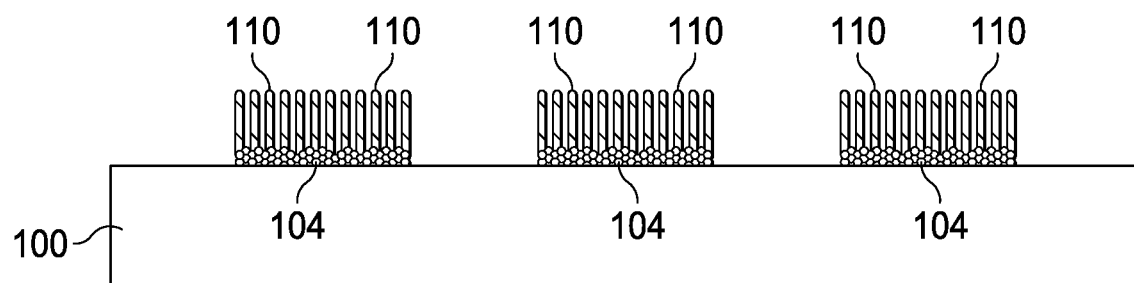
FIG. 3D1
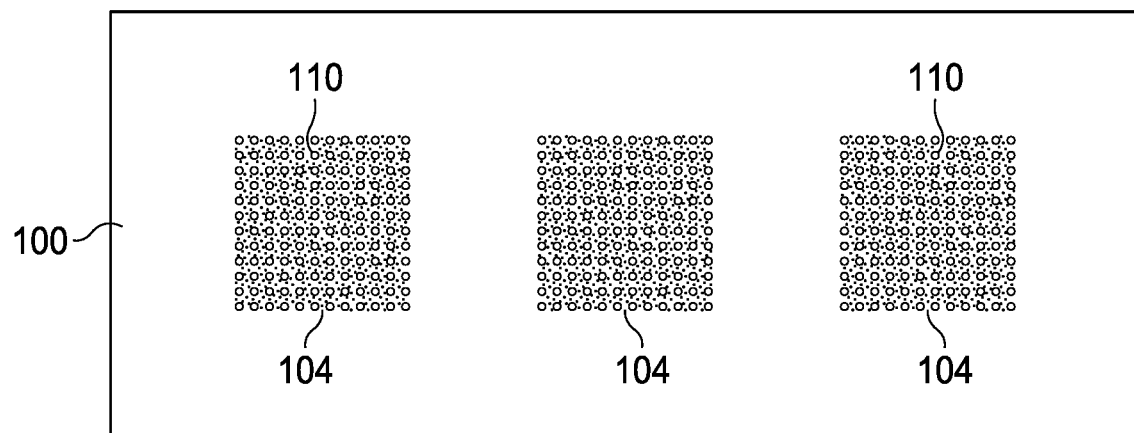
FIG. 3D2

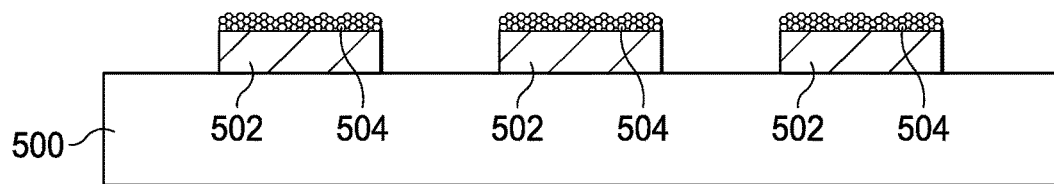
FIG. 4A1
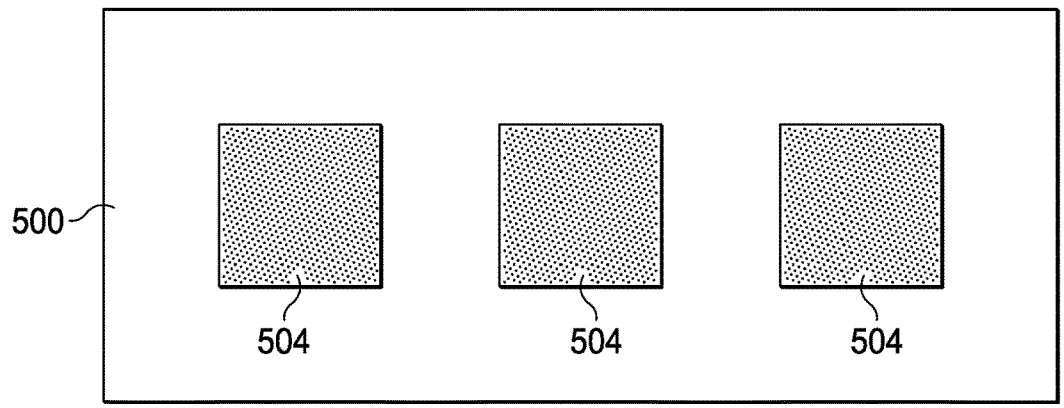
FIG. 4A2
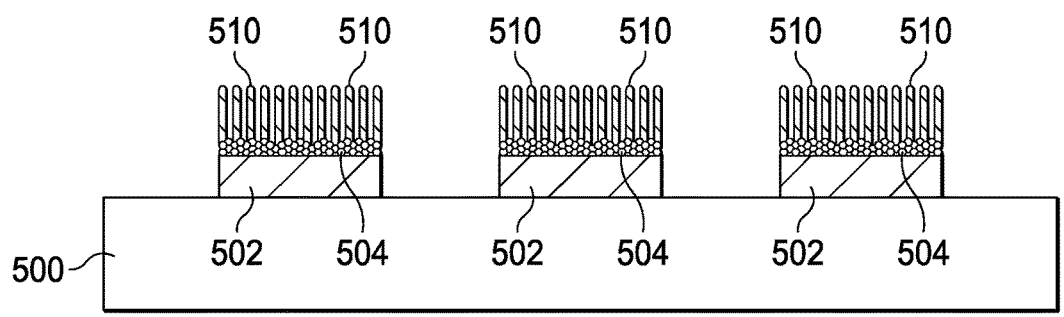
FIG. 4B1
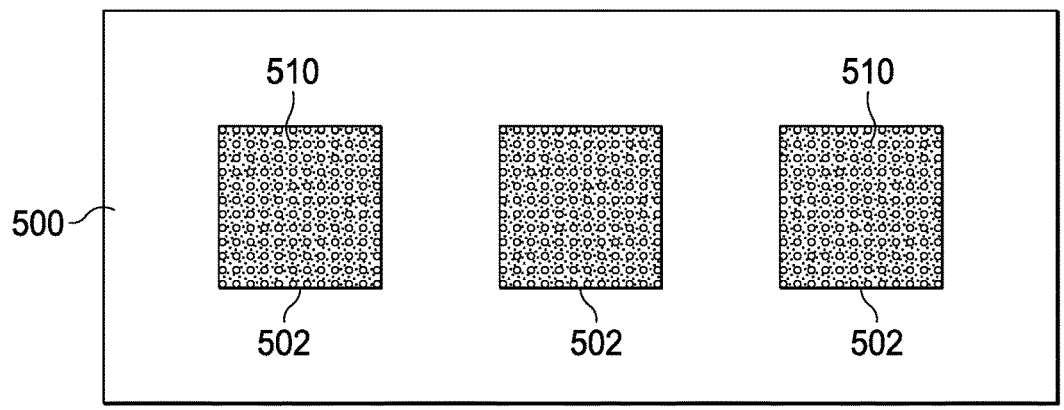
FIG. 4B2

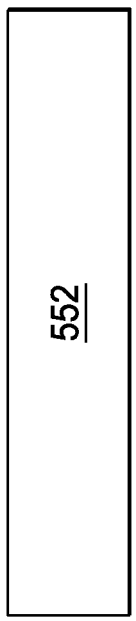
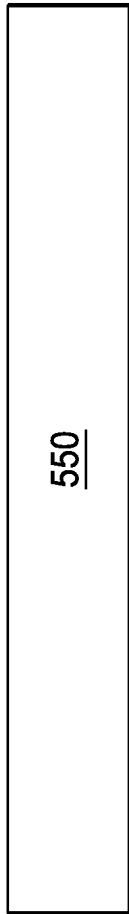
FIG. 4C1
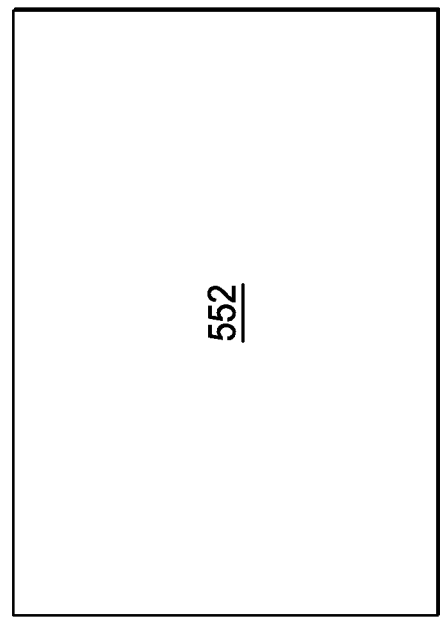
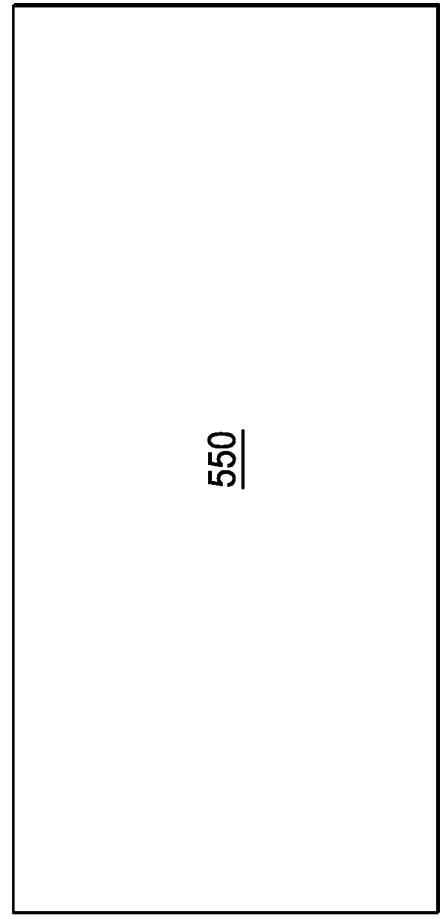
FIG. 4C2

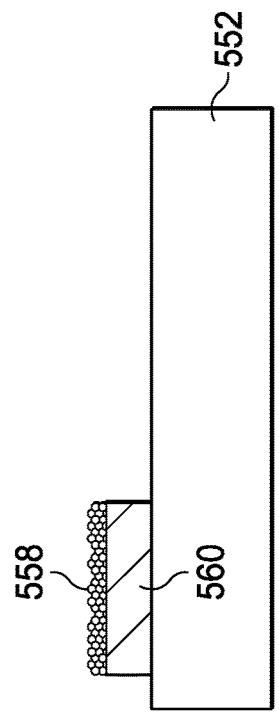
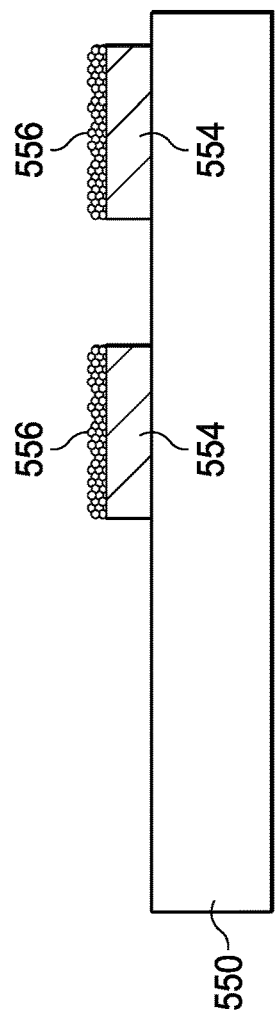
FIG. 4D1
FIG. 4D2

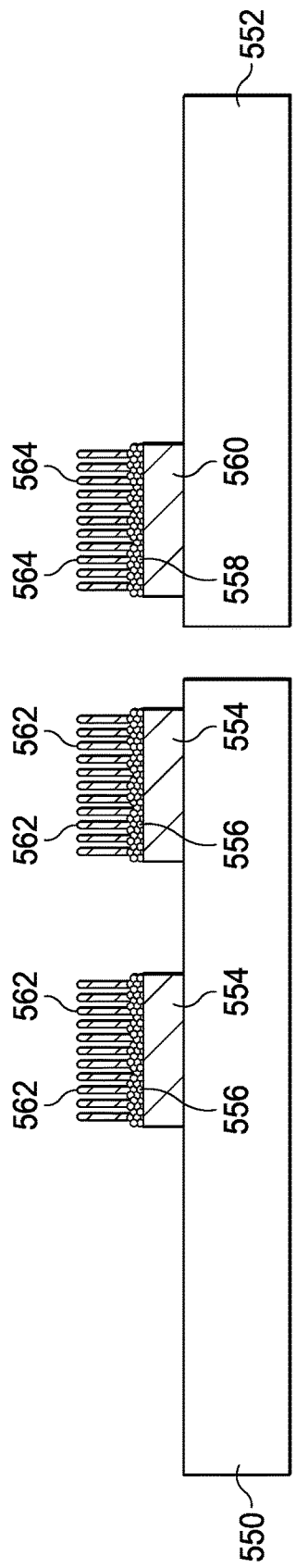
FIG. 4E1
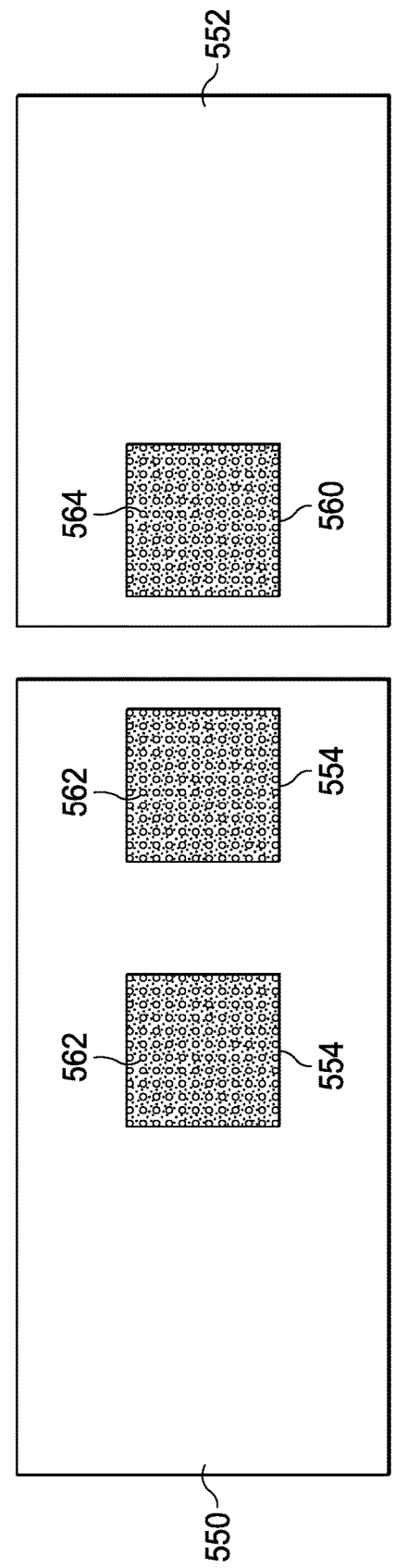
FIG. 4E2

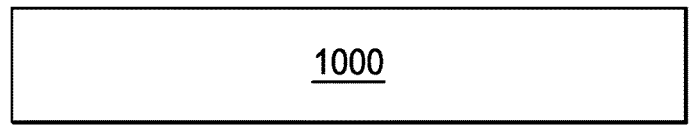
FIG. 9A1
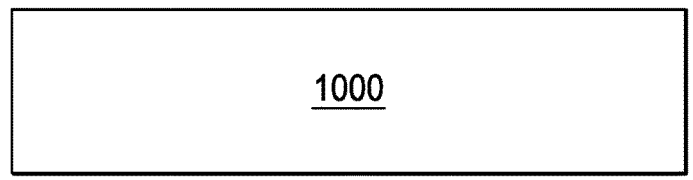
FIG. 9A2
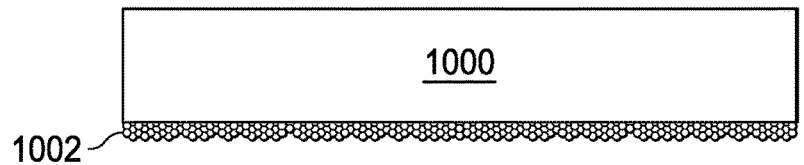
FIG. 9B1
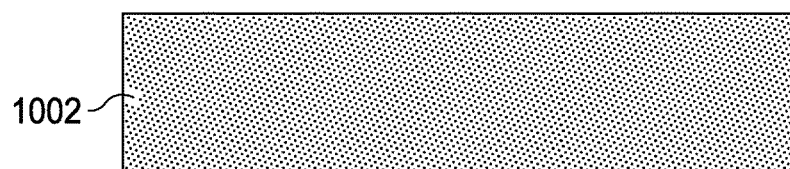
FIG. 9B2

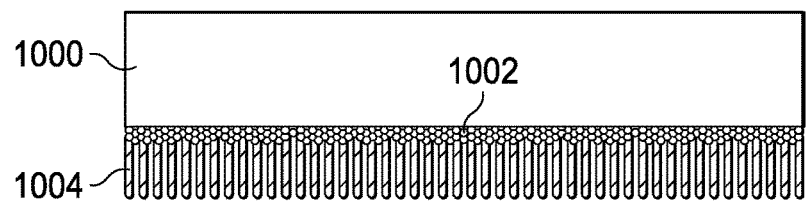
FIG. 9C1
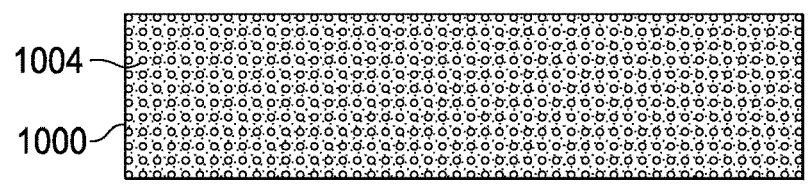
FIG. 9C2
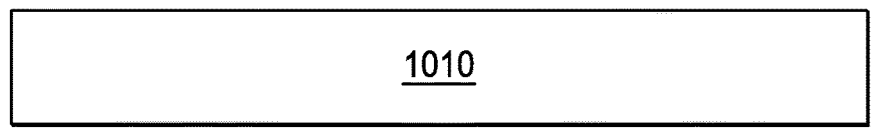
FIG. 9D1
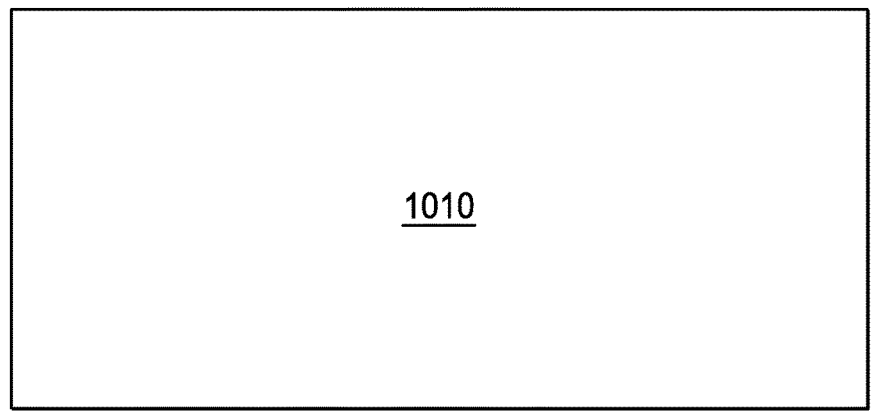
FIG. 9D2

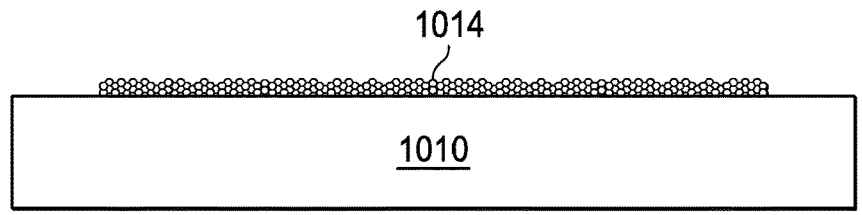
FIG. 9E1
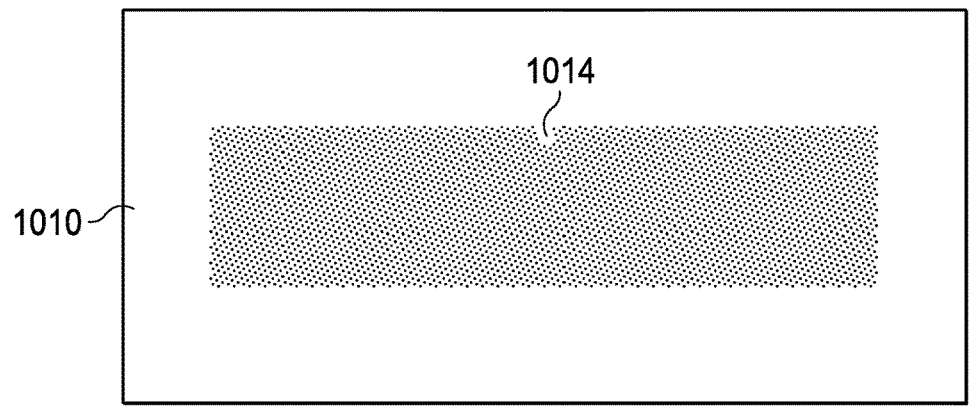
FIG. 9E2
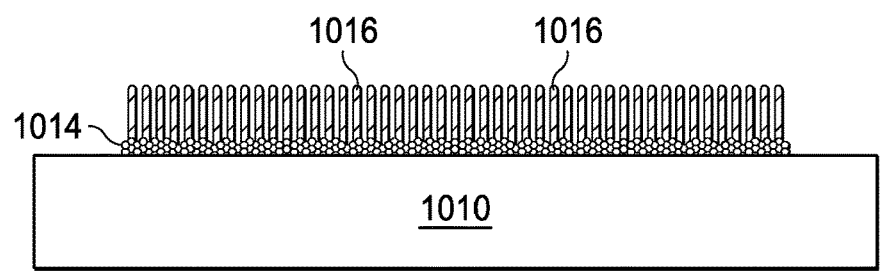
FIG. 9F1
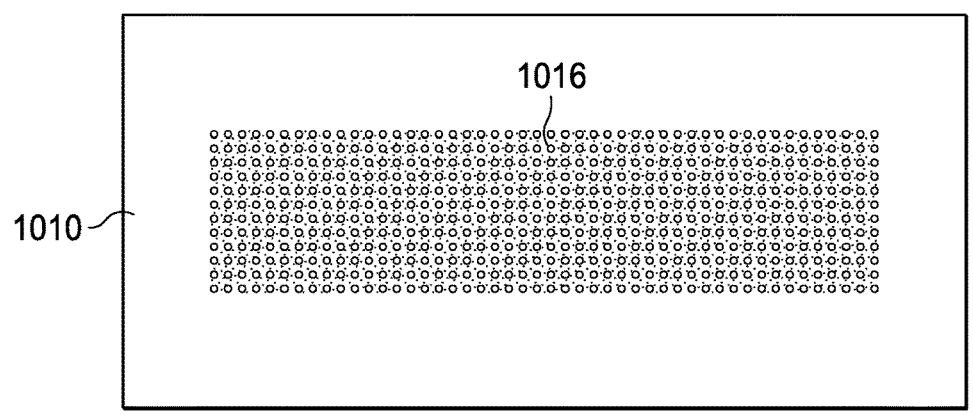
FIG. 9F2

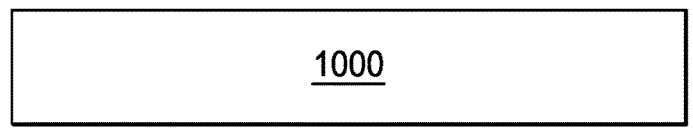
FIG. 10A1
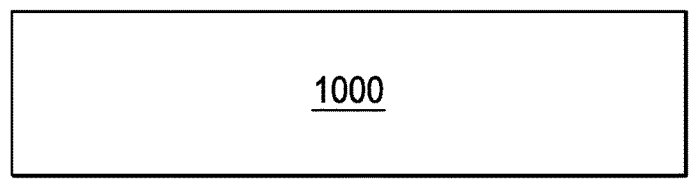
FIG. 10A2
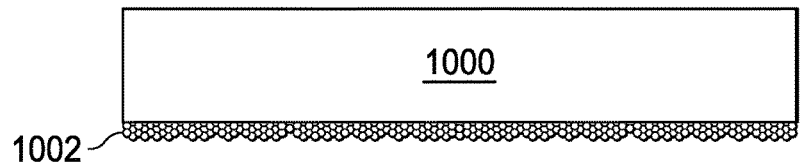
FIG. 10B1
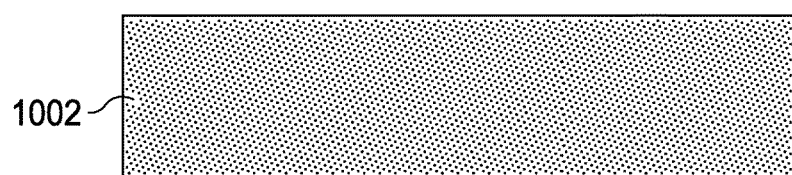
FIG. 10B2

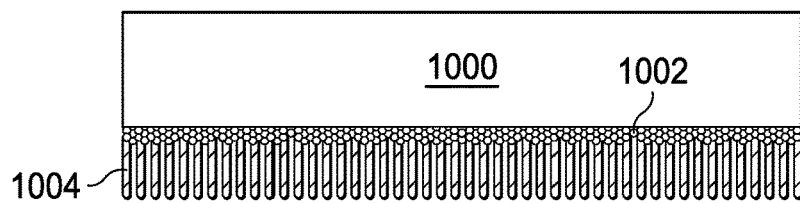
FIG. 10C1
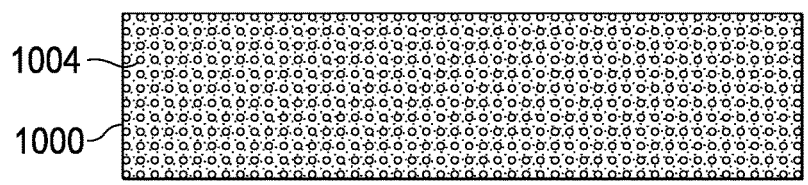
FIG. 10C2
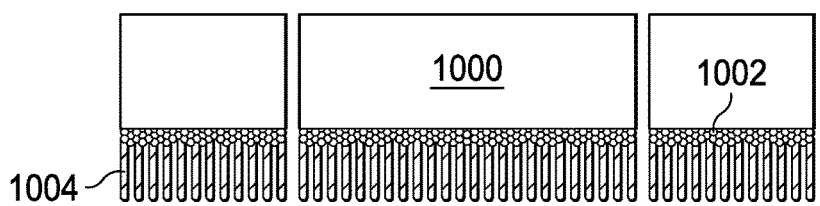
FIG. 10D1
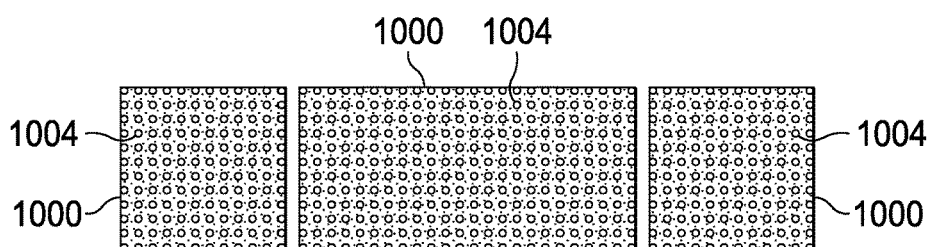
FIG. 10D2

NANOWIRES PLATED ON NANOPARTICLES

CROSS-REFERENCE TO RELATED APPLICATIONS

The present is a Continuation of application Ser. No. 16/843,559 filed Apr. 8, 2020, now U.S. Pat. No. 11,282,807, which claims priority to the following U.S. provisional patent applications filed on Apr. 8, 2019, all of which are hereby incorporated herein by reference in their entireties: App. No. 62/830,944; App. No. 62/830,989; App. No. 62/831,000; App. No. 62/831,016; and App. No. 62/831,065.

BACKGROUND

Many devices include multiple components that are attached to each other. Such attached components can be found in virtually any type of device or apparatus, including electronics, motor vehicles, furniture, clothing and apparel, and the like. The components are often attached to each other using an adhesive (e.g., glue), nails, screws, or other such materials.

SUMMARY

In some examples, a system comprises a set of nanoparticles and a set of nanowires extending from the set of nanoparticles.

In some examples, a system comprises a first surface, a first set of nanoparticles coupled to the first surface, and a first set of nanowires extending from the first set of nanoparticles. The system also comprises a second surface, a second set of nanoparticles coupled to the second surface, and a second set of nanowires extending from the second set of nanoparticles. The first and second sets of nanowires are fused to each other.

In some examples, a method comprises depositing a set of nanoparticles on a surface and positioning a template over the set of nanoparticles, the template having a plurality of orifices extending perpendicular to the surface. The method also comprises electroplating the set of nanoparticles to cause a set of nanowires to extend from the set of nanoparticles and through the plurality of orifices. The method further comprises removing the template from the surface.

BRIEF DESCRIPTION OF THE DRAWINGS

For a detailed description of various examples, reference will now be made to the accompanying drawings in which:

FIGS. 1A1-1E2 depict a process flow for plating a set of nanowires to a set of nanoparticles, in accordance with various examples;

FIG. 2 depicts a close-up, top-down view of a set of nanoparticles on which a set of nanowires may be plated, in accordance with various examples;

FIGS. 3A1-3D2 depict another process flow for plating a set of nanowires to a set of nanoparticles, in accordance with various examples;

FIGS. 4A1-4F depict a process flow for coupling multiple components using nanowires plated on nanoparticles, in accordance with various examples;

FIGS. 9A1-9H depict a process flow for performing a die attach in a semiconductor package using nanowires plated on nanoparticles, in accordance with various examples;

FIGS. 10A1-10H depict another process flow for performing a die attach in a semiconductor package using nanowires plated on nanoparticles, in accordance with various examples;

DETAILED DESCRIPTION

Figure 4F:
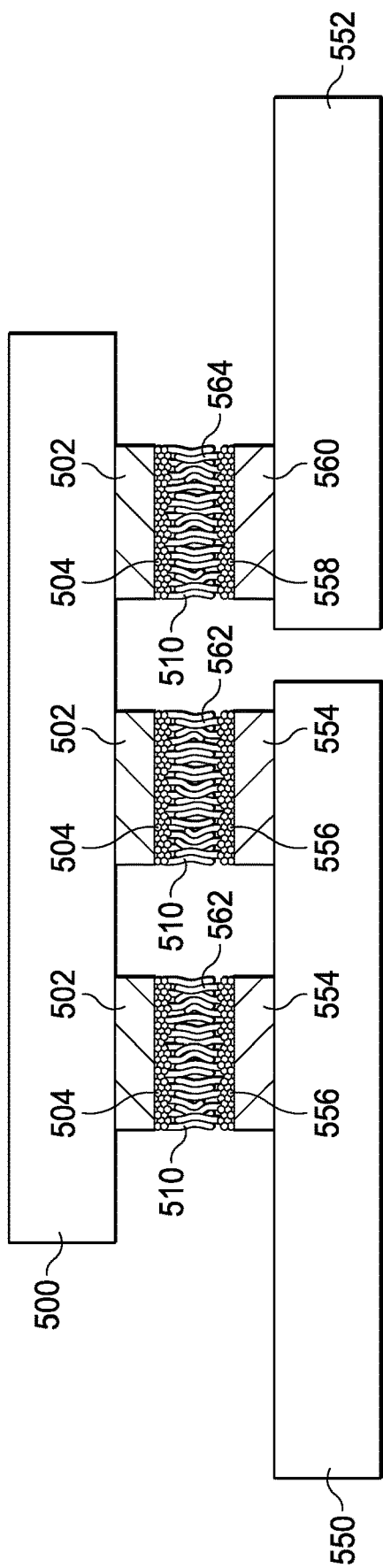

As explained above, a variety of materials are conventionally used to attach multiple components together. Such materials have associated disadvantages relating to adhesion strength, cost, mechanical stability, electrical properties, etc. For example, multiple components may be attached to each other in a semiconductor package using solder, which has electromigration problems introduced by the presence of different metals abutting each other. In some cases, multiple components may be attached to each other in a semiconductor package using nanoparticles, but the nanoparticle-to-nanoparticle coupling is generally weak and mechanically unstable. Glue may be used to form a stronger and more stable mechanical connection, but glue has poor thermal and electrical conductivity. A variety of other techniques may be used in the semiconductor context, each entailing some combination of tedium, excessive cost, excessive space, poor mechanical stability, poor electrical and thermal conductivity, and numerous photolithography steps. Other components, for example in automobiles, may be attached to each other using screws, nuts, and bolts, but these materials occupy excessive space and are tedious to implement. Similar problems exist with most, if not all, materials used to attach components to each other.

This disclosure describes a novel technique for attaching two or more components to each other, regardless of the context or particular application in which those components are deployed. The technique includes the deposition and melting of a set of nanoparticles on the surfaces of the components to be attached. The technique further includes the plating of a set of nanowires on each set of nanoparticles. The sets of nanowires are then coupled to each other. Because the surface area of a nanowire is significantly greater than the volume of the nanowire, the number of surface defects on the nanowire is significant, thereby depressing the melting point of the nanowire. Because nanowires have significantly depressed melting points (e.g., room temperature, such as 65 degrees to 80 degrees Fahrenheit, or up to around 175 degrees Fahrenheit in some examples), pressing the nanowires of one component against the nanowires of another component causes the nanowires to melt due to the ambient temperature and the pressure applied. In this way, the nanowires of multiple components can simply be pressed together at room temperature to cause the components to melt and to be attached to each other. Relative to other techniques for coupling components together, the nanowires provide strong adhesion, mechanical stability, little or no electromigration, reduced tedium, and good electrical and thermal conductivity. In addition, the use of nanoparticles to plate the nanowires provides additional mechanical stability to the nanowires, preventing the nanowires from flaking off of the components to which they are attached.

Various examples for fabricating and deploying nanowire-plated-nanoparticles are now described with respect to the drawings. Although these examples are primarily described in the context of semiconductor devices, the nanowire-plated-nanoparticles described herein may be deployed in any of a variety of applications and contexts, virtually without limitation. Any application in which two or more components are attached to each other may find benefit from the use of the nanowire-plated-nanoparticles described herein.

FIGS. 1A1-1E2 depict a process flow for plating a set of nanowires to a set of nanoparticles, in accordance with various examples. The process flow begins in FIG. 1A1 with the deposition of a set of nanoparticles 104 on a surface (the drawings depict three sets of nanoparticles 104 to illustrate the fact that, in at least some applications, the process described below can be applied in multiple instances simultaneously). In some examples, such as the one depicted in FIG. 1A1, the surface comprises a metal layer (e.g., a solid metal layer of any desired thickness) positioned on a semiconductor wafer 100, for example a metal layer 102. The remainder of the discussion of FIGS. 1A1-1E2 assumes that the surface includes the metal layer 102. In other examples, as described in greater detail below, the surface comprises a semiconductor wafer, such as the wafer 100. In examples, other types of surfaces besides the metal layer 102 and the wafer 100 may be used. In addition, components other than semiconductor wafers may be used, for example in non-semiconductor contexts.

In some examples, the metals in the set of nanoparticles 104 and the metal layer 102 are identical (e.g., copper, titanium, or titanium-tungsten). In other examples, the metals in the set of nanoparticles are different. For instance, in some examples, the set of nanoparticles 104 comprises titanium or titanium-tungsten, and the metal layer 102 comprises copper. In some examples, the set of nanoparticles 104 comprises nickel palladium, and the metal layer 102 comprises copper. Any of a variety of metals may be used, depending on various factors including cost, electromigration between metals, availability, etc.

In some examples, the set of nanoparticles 104 is deposited on the metal layer 102 using a printing technique, for example an additive manufacturing technique. In some examples, the set of nanoparticles 104 is electroplated onto the metal layer 102. In some examples, the set of nanoparticles 104 is deposited using a sputtering technique. Other techniques are contemplated and included in the scope of this disclosure.

In some examples, the set of nanoparticles 104 has a thickness ranging from 100 nanometers (nm) to 100 microns, with a thicker set of nanoparticles 104 resulting in a more mechanically stable nanoparticle-nanowire structure. In some examples, the set of nanoparticles 104 has a uniform thickness throughout its length and width, and in other examples, the set of nanoparticles 104 has a non-uniform thickness throughout its length and width. The remaining dimensions of the set of nanoparticles 104 may be chosen as desired. In some examples, each nanoparticle in the set of nanoparticles 104 is generally spherical and has a diameter ranging from approximately 0.5 microns to 1.5 microns. The specific physical parameters of the set of nanoparticles 104 and the individual nanoparticles within the set of nanoparticles 104 may vary, and all such variations are encompassed within the scope of this disclosure. The length, width, and thickness of the metal layer 102 may be chosen as desired. Similarly, the number of metal layers 102 (and attendant sets of nanoparticles 104) may be chosen as desired, with certain applications benefiting from more and other applications benefiting from fewer.

After the set of nanoparticles 104 is positioned on the metal layer 102, the set of nanoparticles 104 is melted to cause the nanoparticles in the set of nanoparticles 104 to diffuse into the metal layer 102. Any suitable technique may be used to melt the set of nanoparticles 104, for example a laser or any other heat source. The diameter of the nanoparticles in the set of nanoparticles 104, as well as the thickness of the set of nanoparticles 104, may determine the melting point of the set of nanoparticles 104. In some examples, a nanoparticle diameter of approximately 1 micron and a thickness for the set of nanoparticles 104 of approximately 100 nm may result in a melting point of approximately 200 degrees Fahrenheit, although the specific number can vary based on a variety of factors (e.g., metal used, physical parameters of the nanoparticles and the set of nanoparticles 104). FIG. 1A2 shows a top-down view of the structure of FIG. 1A1.

After the set of nanoparticles 104 has been diffused into the metal layer 102, nanowires may be plated onto the set of nanoparticles 104. Photolithography techniques may be used to produce a photoresist 106 in the pattern shown in FIG. 1B1, abutting the set of nanoparticles 104. For example, a photoresist may be applied, exposed using a suitably patterned mask, and developed to produce the photoresist 106. In some examples, a top surface of the photoresist 106 is flush or at least approximately flush with the top surface of the set of nanoparticles 104. For example, if the thickness of the set of nanoparticles 104 is non-uniform, the set of nanoparticles 104 will have an uneven top surface and thus the top surface of the photoresist 106 is approximately flush with the top surface of the set of nanoparticles 104. By "approximately flush," it is meant that the top surface of the photoresist 106 is at or above the lowest point of the set of nanoparticles 104 and at or below the highest point of the set of nanoparticles 104, although the scope of this disclosure is not limited as such.

In FIG. 1C1, a template 108 is coupled to the photoresist 106 and is usable to plate nanowires onto the set of nanoparticles 104. This template may comprise, for example, a TEFLON® (polytetrafluoroethylene) filter. In other examples, the template 108 comprises plastic. In some examples, the template 108 comprises any suitable type of metal (e.g., anodized aluminum or nickel). The template 108 rests on the photoresist 106 and on the set of nanoparticles 104 as shown. The photoresist 106 is not needed to mechanically support the template 108; because the set of nanoparticles 104 is negligibly thin in actual implementation as described above, the template 108 may simultaneously rest on the wafer 100 and the set of nanoparticles 104 in the absence of the photoresist 106, as described below (with the thicknesses of the metal layer 102 and the photoresist 106 being exaggerated in the drawings for clarity). Rather, the photoresist 106 is present in some examples to adhere to the template 108 in the event that the template 108 is composed of a material that does not adhere firmly to the wafer 100. If the template 108 is composed of a material that adheres firmly to the wafer 100, the photoresist 106 may be omitted.

Referring still to FIG. 1C1, the template 108 includes groups of orifices 109 extending perpendicularly to the metal layer 102 (or, in the absence of the metal layer 102, perpendicularly to the wafer 100). Each group of orifices 109 is positioned above a different set of nanoparticles 104, as shown. FIG. 1C2 depicts a top-down view of the structure of FIG. 1C1. As FIG. 1D1 depicts, an electroplating process is then performed, whereby a set of nanowires 110 is plated onto the set of nanoparticles 104. Any suitable metal may be used when plating the set of nanowires 110. In some examples, gold is used to plate the set of nanowires 110. In some examples, copper is used to plate the set of nanowires 110. In some examples, titanium is used to plate the set of nanowires 110. In some examples, tungsten is used to plate the set of nanowires 110. In examples, the various nanowires described in this disclosure are metallic nanowires and the various nanoparticles described in this disclosure are metallic nanoparticles.

Still referring to FIG. 1D1, in some examples, the orifices 109 in the template 108 are sized appropriately to form wires at a nanoscale. For example, a nanowire in the set of nanowires 110 may have a length that is at least twice its diameter. In some examples, a nanowire in the set of nanowires 110 has a length that is at least 10 times its diameter. In some examples, a nanowire in the set of nanowires 110 has a length that is at least 100 times its diameter. In some examples, a nanowire in the set of nanowires 110 has a length that is at least 1000 times its diameter. In some examples, a nanowire in the set of nanowires 110 has a diameter ranging from 0.5 microns to 1.5 microns. In some examples, a nanowire in the set of nanowires 110 has a diameter of 1 micron or no more than 1 micron. In some examples, a nanowire in the set of nanowires 110 has a length of at least 2 microns. In other examples, other diameters and length-to-diameter ratios of nanowires are contemplated, and all such measurements and combinations fall within the scope of this disclosure. The orifices 109 may have dimensions similar to the example dimensions given for the nanowires above. FIG. 1D2 depicts a top-down view of the structure of FIG. 1D1.

The various dimensions described for the nanowires and nanoparticles are not mere design choices. Rather, adjusting each dimension to be larger or smaller may provide specific functional benefits. For example, adjusting a nanowire length to be greater and/or a nanowire diameter to be smaller, such that the ratio of length to diameter increases, may increase the surface area of the nanowire. Increasing the surface area of the nanowire increases the number of defects present, thereby depressing the melting point of the nanowire and making it easier to fuse the nanowire to other materials without requiring high temperature or pressure.

In FIG. 1E1, the photoresist 106 and the template 108 are removed. For example, the photoresist 106 may be removed using a resist stripping technique (e.g., wet or dry etching). The template 108 may be removed, for example, using the same resist stripping technique as used for the photoresist 106 (in the case of a TEFLON® or plastic template 108) or using a specific metal etch corresponding to the metal(s) of which the template 108 is composed. Removal of the photoresist 106 and the template 108 leaves the structure shown in FIG. 1E1, which includes the wafer 100, metal layers 102, sets of nanoparticles 104, and sets of nanowires 110 plated on the sets of nanoparticles 104. FIG. 1E2 depicts a top-down view of the structure of FIG. 1E1. FIG. 2 depicts a detailed view of the set of nanoparticles 104.

As explained above, a set of nanoparticles may be deposited on virtually any surface. In FIGS. 1A1-1E2 and 2, the set of nanoparticles 104 is deposited on a metal layer 102. In other examples, such as in FIGS. 3A1-3D2 and 4A-4B, the set of nanoparticles 104 is deposited directly on the wafer 100 (although, again, surfaces other than the wafer 100 may be used). In particular, FIGS. 3A1-3D2 depict another process flow for plating a set of nanowires to a set of nanoparticles, in accordance with various examples. The process flow of FIGS. 3A1-3D2 is nearly identical to the process flow of FIGS. 1A1-1E2, except that the metal layer 102 and the photoresist 106 are both omitted. As explained above, the photoresist 106 may be omitted if the template 108 is composed of a material that adheres firmly to the wafer 100 (or other surface). In this case, the template 108 rests on the wafer 100 and on the set of nanoparticles 104. As explained above, the template 108 is able to rest simultaneously on the wafer 100 and the set of nanoparticles 104 because the thickness of the set of nanoparticles 104 is virtually negligible. In FIGS. 3B1 and 3C1, however, the thickness of the set of nanoparticles 104 is exaggerated to provide clarity regarding the structure being fabricated by the process flow of FIGS. 3A1-3D2, and for this reason, the template 108 is shown as not making direct contact with the wafer 100. In actual implementation, however, the template 108 may make direct contact with the wafer 100.

FIGS. 4A1-4F depict a process flow for coupling multiple components using nanowires plated on nanoparticles, in accordance with various examples. In particular, FIG. 4A1 depicts a component 500. The component 500 may be any component in any system, such as a semiconductor wafer, an automotive part, a consumer electronic device, a household appliance, an article of clothing or jewelry, etc. Metal layers 502, in some examples, may be similar to the metal layers 102 described above in terms of composition, size, shape, and/or fabrication, and are positioned on a surface of the component 500. Sets of nanoparticles 504, in some examples, may be similar to the sets of nanoparticles 104 described above in terms of composition, size, shape, and/or fabrication, and are positioned on the metal layers 102 as shown. FIG. 4A2 depicts a top-down view of the structure of FIG. 4A1. As shown in FIG. 4B1, sets of nanowires 510 are plated on the sets of nanoparticles 504 (for brevity, photolithography steps are not shown), with the sets of nanowires 510 being similar to the sets of nanowires 110 in terms of composition, size, and fabrication. FIG. 4B2 shows a top-down view of the structure of FIG. 4B1.

In FIG. 4C1, a pair of components 550, 552 is depicted, where the components 550, 552 are any components in any system, such as a package lead frame, an automotive part, a consumer electronic device, a household appliance, an article of clothing or jewelry, etc. The components 550, 552 may be identical or different in composition, size, shape, or fabrication. Two components 550, 552 are depicted to illustrate the adaptability of the nanowire-plated-nanoparticle technology described herein to a variety of situations, such as the coupling of a single component to multiple other components using the technology described herein. FIG. 4C2 depicts a top-down view of the structure of FIG. 4C1. In FIG. 4D1, metal layers 554 are formed on the component 550, and metal layer 560 is formed on the component 552. The metal layers 554, 560 may be similar to the metal layers 102 described above in terms of composition, size, shape, and/or fabrication. Sets of nanoparticles 556 are positioned on the metal layers 554, and the set of nanoparticles 558 is positioned on the metal layer 560. The sets of nanoparticles 556, 558 may be similar to the sets of nanoparticles 104 described above in terms of composition, size, shape, and/or fabrication. FIG. 4D2 depicts a top-down view of the structure of FIG. 4D1. In FIG. 4E1, sets of nanowires 562 are plated on the sets of nanoparticles 556 (again, the photolithography steps being omitted from illustration for brevity), and a set of nanowires 564 is plated on the set of nanoparticles 558. The sets of nanowires 562, 564 may be similar to the sets of nanowires 110 in terms of composition, size, shape, and fabrication. FIG. 4E2 depicts a top-down view of the structure of FIG. 4E1.

In FIG. 4F, the component 550, with its corresponding metal layers, sets of nanoparticles, and sets of nanowires, is coupled to the components 550, 552, with their corresponding metal layers, sets of nanoparticles, and sets of nanowires. In particular, the sets of nanowires 510 are aligned with the sets of nanowires 562, 564 and are subsequently pressed together. When the sets of nanowires 510 are pressed against the sets of nanowires 562, 564, the nanowires fuse together. In general, any two nanowires may fuse together at any point or points of contact. In examples, the fusion of two nanowires generally occurs along the lengths of the nanowires, as described below. A fusion along the lengths of two nanowires may be complete, meaning that the entire lengths of the two nanowires are fused together. In some examples, the fusion along the lengths of two nanowires may be incomplete, meaning that only portions of the lengths of the two nanowires are fused together, and these portions may be contiguous or separate. In some examples, a pair of nanowires may fuse together using a distal end of one of the nanowires in the pair. In some examples, three or more nanowires may bunch together and couple together along their lengths or in another suitable manner. In some examples, one or more nanowires may wrap around one or more other nanowires. Any and all such manners of fusion are contemplated and included within the scope of this disclosure. Fusion between nanowires may occur as a result of nanowires contacting each other with a minimum amount of pressure and/or temperature. For example, at room temperature, pressures greater than 100 MPa are sufficient to cause fusion. Temperatures of approximately 175 degrees Fahrenheit are sufficient to cause fusion without any additional pressure being added. Other combinations of pressure and temperature sufficient to cause melting and subsequent fusion of nanowires also may be used.

Figure 5:
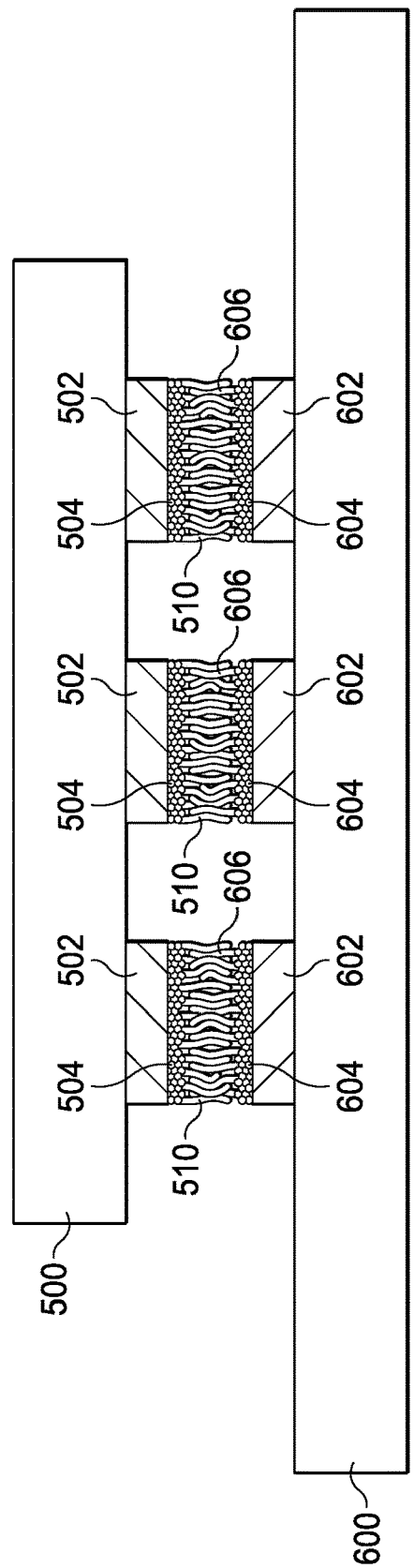
FIG. 5 depicts a structure resulting from the process flow of FIGS. 4A1-4F, in accordance with various examples.
Figure 6:
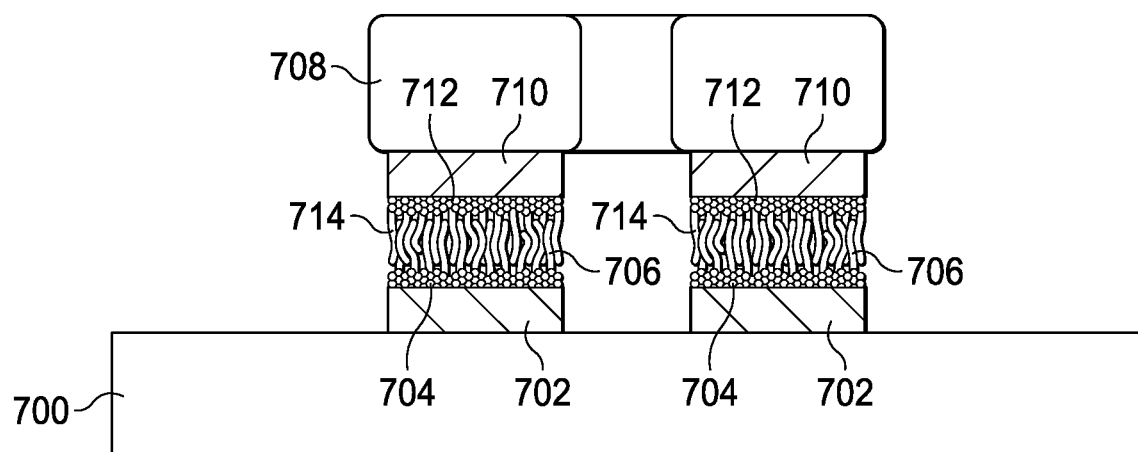
FIG. 6 depicts another structure resulting from the process flow of FIGS. 4A1-4F, in accordance with various examples.

FIGS. 5 and 6 depict additional structures resulting from the process flow of FIGS. 4A1-4F, in accordance with various examples. In FIG. 5, one component 500 couples to another component 600 using nanowire-plated-nanoparticles. The structure of FIG. 5 differs from that of FIG. 4F in that the structure of FIG. 5 comprises two components coupling to each other instead of one component coupling to two other components. In this way, FIGS. 4F and 5 depict the adaptability of the novel techniques herein to a variety of applications. In some examples, the components 500, 600 are semiconductor wafers (or post-singulation dies). Metal layers 502 are coupled to the component 500, with sets of nanoparticles 504 positioned on the metal layers 502 and sets of nanowires 510 plated on the sets of nanoparticles 504. Metal layers 602 are coupled to the component 600, with sets of nanoparticles 604 positioned on the metal layers 602 and sets of nanowires 606 plated on the sets of nanoparticles 604. The metal layers, sets of nanoparticles, and sets of nanowires depicted in FIG. 6 may be similar in composition, size, shape, and/or fabrication to the metal layers, sets of nanoparticles, and sets of nanowires described above.

In FIG. 6, a component 708 couples to a component 700 using nanowire-plated-nanoparticles. Specifically, metal layers 710 are positioned on the component 708, with sets of nanoparticles 712 positioned on the metal layers 710. Sets of nanowires 714 are plated on the sets of nanoparticles 712. Similarly, metal layers 702 are positioned on the component 700, with sets of nanoparticles 704 positioned on the metal layers 702. Sets of nanowires 706 are plated on the sets of nanoparticles 704. The metal layers, sets of nanoparticles, and sets of nanowires depicted in FIG. 6 may be similar in composition, size, shape, and/or fabrication to the metal layers, sets of nanoparticles, and sets of nanowires described above. In FIG. 6, the components 708, 700 may be any components of any system, but in at least some examples, the component 708 comprises a passive electrical component (e.g., a resistor, capacitor, inductor, sensor) and the component 700 comprises a semiconductor wafer (or post-singulation die).

The examples of FIGS. 4A1-4F, 5, and 6 include metal layers on which sets of nanoparticles are positioned. Such metal layers may be formed as described above with respect to FIGS. 1A1-1E2 and 2. However, as described above with respect to FIGS. 3A1-3D2, in some examples, a metal layer may be omitted and a set of nanoparticles (along with nanowire plating) may be formed directly on the surface of the component. Accordingly, although the examples of FIGS. 4A1-4F, 5, and 6 include metal layers, this disclosure contemplates examples that are identical to those of FIGS. 4A1-4F, 5, and 6 but without the use of the metal layers depicted in those drawings. Thus, in such examples, the sets of nanoparticles may be positioned directly on the component surface, and sets of nanowires may be plated on the sets of nanoparticles.

Figure 7:
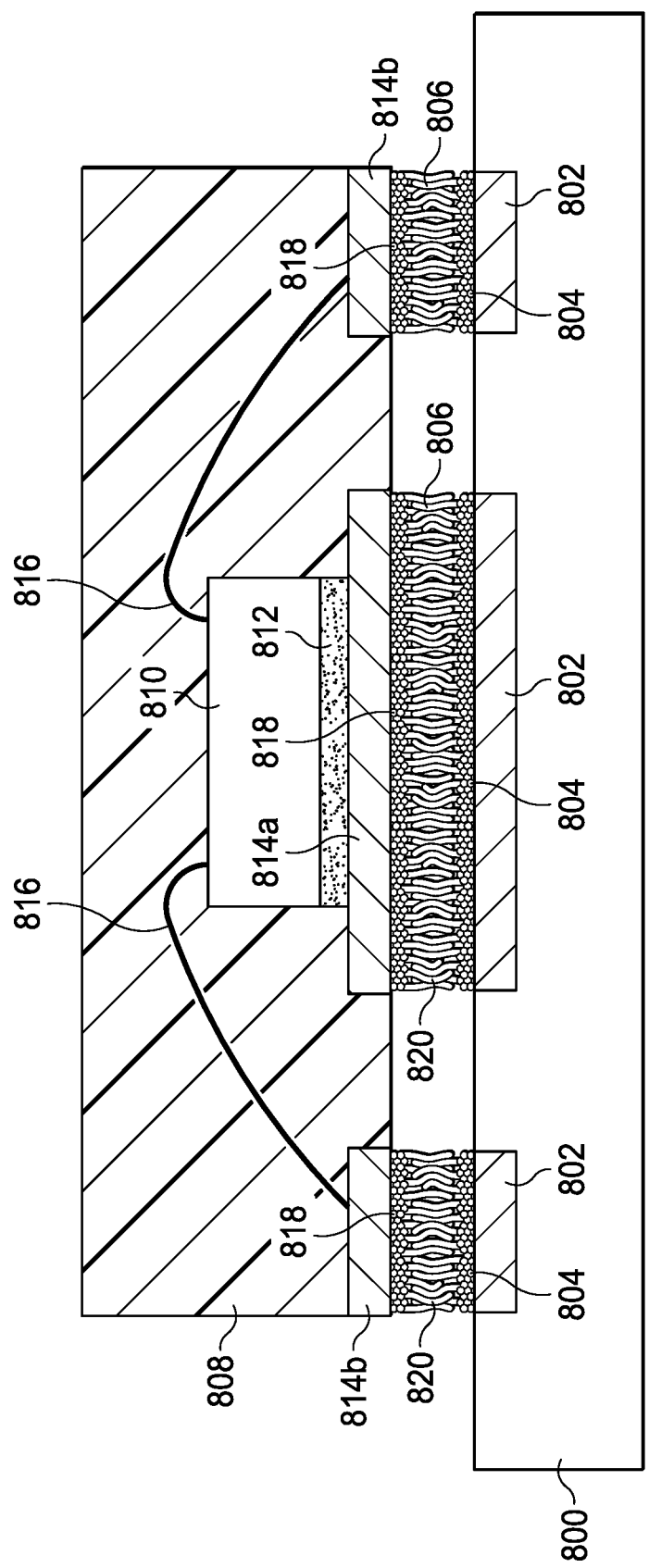
FIG. 7 depicts another structure resulting from the process flow of FIGS. 4A1-4F, in accordance with various examples.

FIG. 7 depicts another structure resulting in part from the process flow of FIGS. 4A1-4F, in accordance with various examples. Specifically, in FIG. 7, a semiconductor package is coupled to another component, such as a printed circuit board (e.g., PCB), using nanowire-plated-nanoparticles. FIG. 7 depicts a component 800 (e.g., PCB) having metal layers 802 formed therein. In alternative examples, the metal layers 802 are formed on, instead of in, the component 800. Sets of nanoparticles 804 are positioned on the metal layers 802. Sets of nanowires 806 are plated on the sets of nanoparticles 804. In addition, FIG. 7 depicts a semiconductor package 808 comprising a die 810 mounted on a die pad 814a using a die attach 812 (e.g., solder). The die 810 is communicably coupled with package leads 814b via bond wires 816. (Various alternative die and lead frame configurations within the semiconductor package 808, e.g., flip chip, stacked die, clipped, etc., are contemplated and included within the scope of this disclosure, and particularly within the scope of the example of FIG. 7.) Sets of nanoparticles 818 are formed on the die pad 814a and package leads 814b, and sets of nanowires 820 are plated on the sets of nanoparticles 818. The sets of nanowires 820, 806 are pressed together, thereby fusing the nanowires together as described above and causing the package 808 to adhere to the component 800. In FIG. 7, the metal layers, sets of nanoparticles, and sets of nanowires may have the same composition, size, shape, and/or fabrication as the metal layers, sets of nanoparticles, and sets of nanowires described above.

Figure 8:
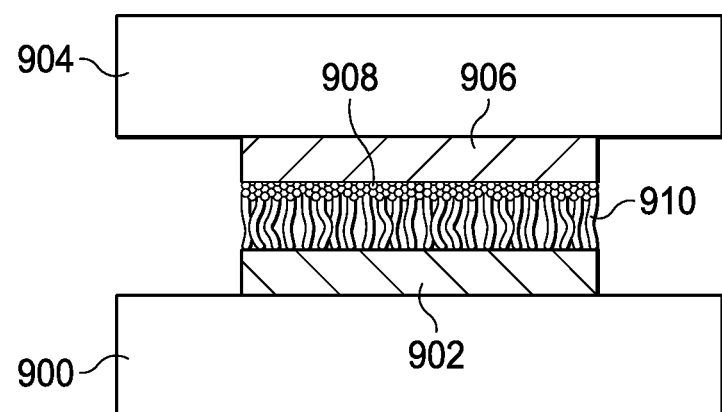
FIG. 8 depicts another structure resulting from a modified version of the process flow of FIGS. 4A1-4F, in accordance with various examples.

Many of the examples described above include two or more components coupling to each other using nanowireplated-nanoparticles, where the nanowires and nanoparticles are present on each of the components being coupled. The scope of this disclosure is not limited, however, to examples in which all components being coupled have nanoparticles and nanowires positioned on them. Rather, the scope of this disclosure includes components that couple together using nanowire-plated-nanoparticles where fewer than all of the components being coupled have nanowires and nanoparticles positioned thereupon. FIG. 8 depicts such a structure, in accordance with various examples. In FIG. 8, components 900 and 904 couple to each other using the nanowire-plated-nanoparticle technology described herein. A metal layer 902 is positioned on the component 900, and a metal layer 906 is positioned on the component 904. As explained above, such metal layers are optional and in some examples may be excluded. The metal layer 906 has positioned thereupon a set of nanoparticles 908, and a set of nanowires 910 is plated on the set of nanoparticles 908. When pressed against the metal layer 902, the set of nanowires 910 fuses to the metal layer 902. The manner in which the set of nanowires 910 fuses to the metal layer 902 is similar to the manner in which nanowires fuse together as described above, e.g., the set of nanowires 910 melts when the appropriate combination of pressure and temperature is applied, thus causing the set of nanowires 910 to fuse to the metal layer 902. This technique may be used to couple any plurality of components together, as desired. In FIG. 8, the metal layers, sets of nanoparticles, and sets of nanowires may have the same composition, size, shape, and/or fabrication as the metal layers, sets of nanoparticles, and sets of nanowires described above.

Figure 9G:
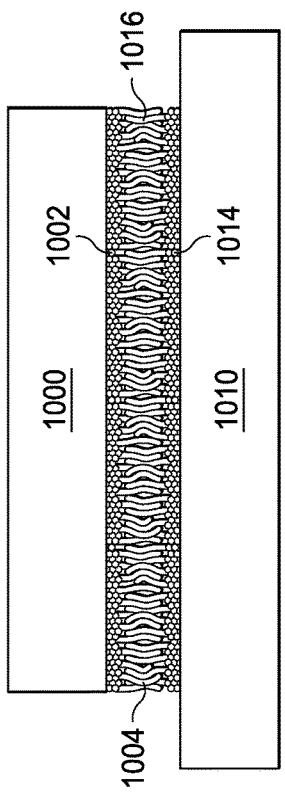
Figure 9H:
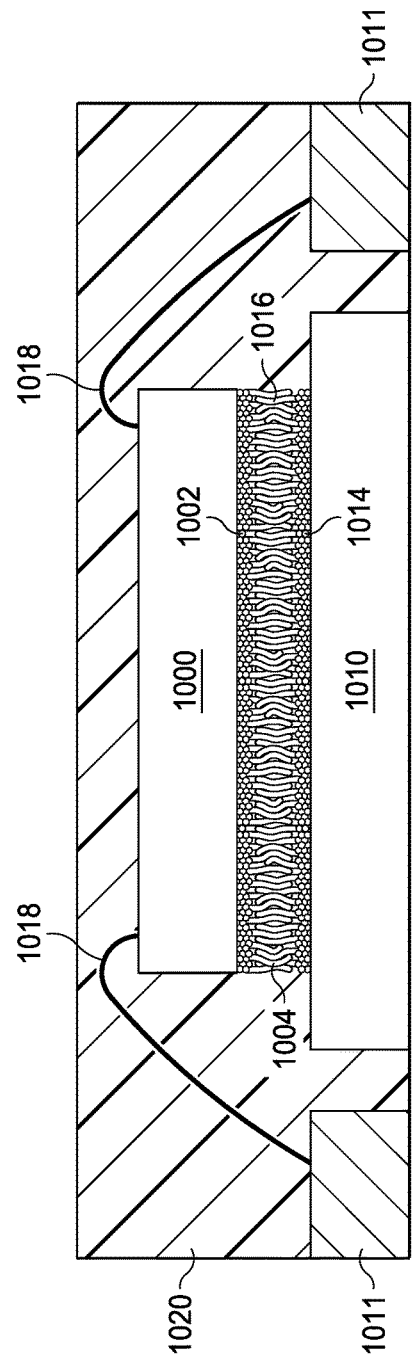

As explained above, FIG. 7 depicts the use of nanowire-plated-nanoparticles on an exterior of a component, such as a semiconductor package, to couple the component to another component. The nanowire-plated-nanoparticles, however, also may be used within a semiconductor package, for example to act as a die attach that couples a semiconductor die to a die pad or other component. FIGS. 9A1-9H depict a process flow for performing a die attach in a semiconductor package using nanowires plated on nanoparticles, in accordance with various examples. In FIG. 9A1, a component 1000, such as a semiconductor die, is provided, and in FIG. 9B1, a set of nanoparticles 1002 is positioned on the component 1000. FIGS. 9A2 and 9B2 depict top-down and bottom-up views of the structures of FIGS. 9A1 and 9B1, respectively. In FIG. 9C1, a set of nanowires 1004 is plated on the set of nanoparticles 1002. (Note that the orientation of the structure in FIG. 9C1 is merely to assist in understanding the assembly of structures described below. Assembly of the structure of FIG. 9C1 (e.g., including electroplating) may be performed with the structure in a different orientation (e.g., rotated 180 degrees).) In some examples, a metal layer, such as those described above, may be included between the component 1000 and the set of nanoparticles 1002, although in FIGS. 9A1-9H, such metal layers are excluded. FIG. 9C2 depicts a bottom-up view of the structure of FIG. 9C1. In FIG. 9D1, a component 1010, such as a lead frame die pad, is provided, and in FIG. 9E1, a set of nanoparticles 1014 is positioned on the component 1010. FIGS. 9D2 and 9E2 depict top-down views of the structures of FIGS. 9D1 and 9E1, respectively. In FIG. 9F1, a set of nanowires 1016 is plated on the set of nanoparticles 1014. FIG. 9F2 depicts a top-down view of the structure of FIG. 9F1. In FIG. 9G, the sets of nanowires 1004, 1016 are pressed together in the manner described above, thereby causing the nanowires to fuse together, also as described above. The structure of FIG. 9G may then be completed by, e.g., the application of wirebonds and a mold compound 120 to cover the structure, as FIG. 9H depicts. In FIG. 9H, bond wires 1018 couple the component 1000 to leads 1011, while the component 1000 is attached to the component 1010 using nanowire-plated-nanoparticles. In FIGS. 9A1-9H, the sets of nanoparticles and sets of nanowires may have the same composition, size, shape, and/or fabrication as the sets of nanoparticles, and sets of nanowires described above.

Figures 10E1, 10E2:
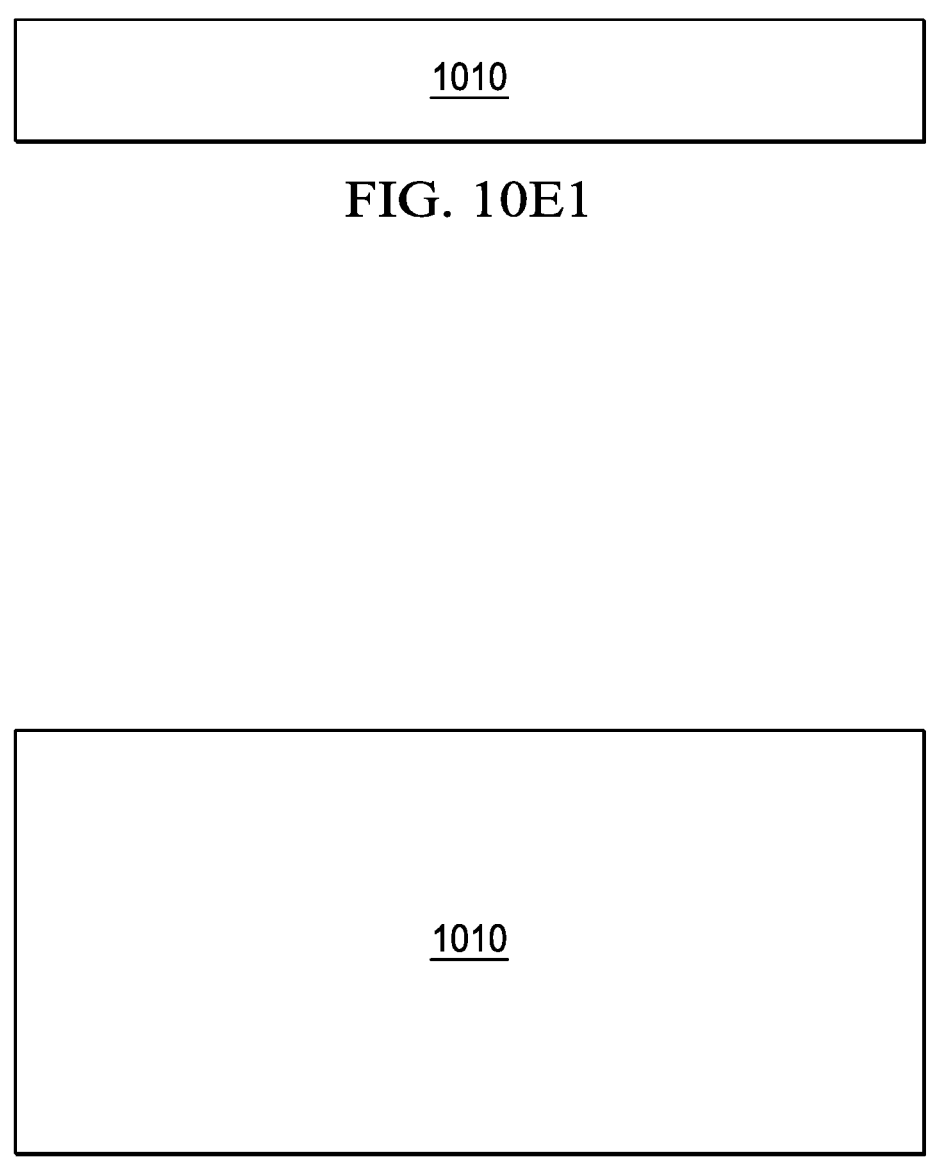
Figure 10F:
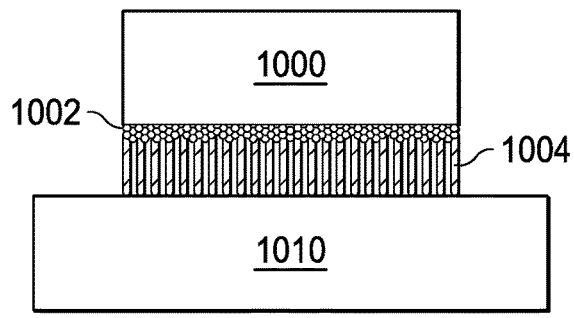
Figure 10G:
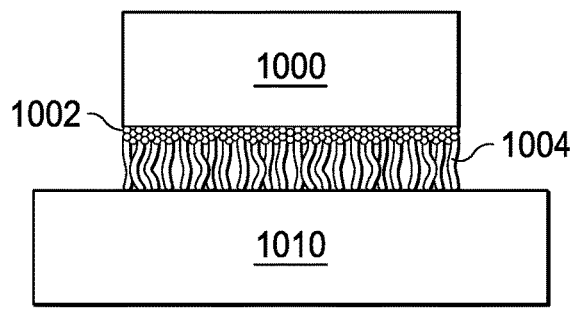
Figure 10H:
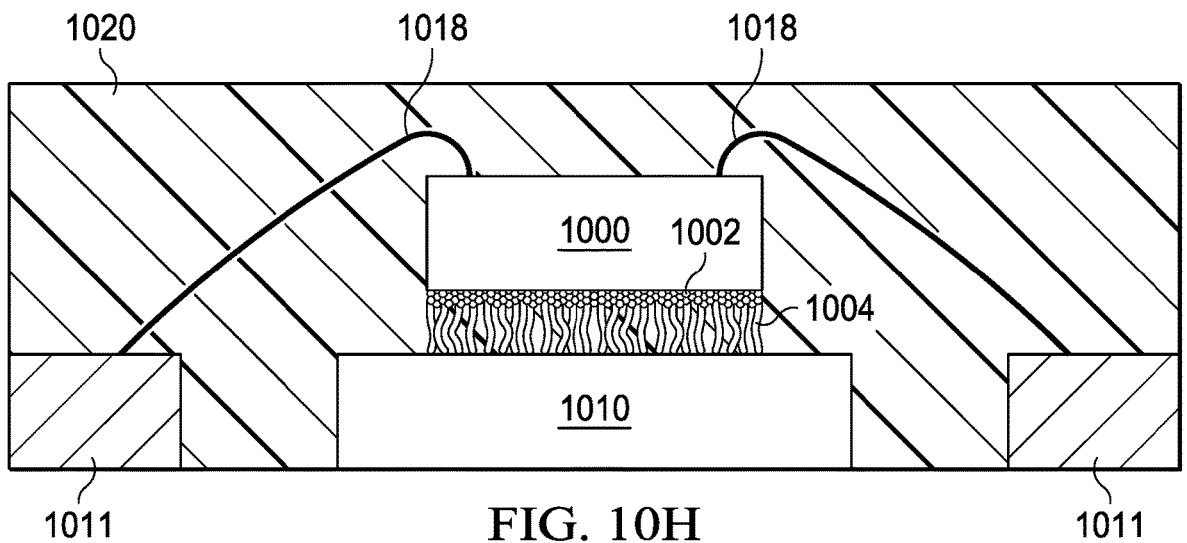

As described above, when multiple components are coupled together, nanowire-plated-nanoparticles are not necessarily present on all components being coupled. FIGS. 10A1-10H depict a process flow similar to that of FIGS. 9A1-9H, but with nanowire-plated-nanoparticles present on only one of the two components being coupled together. In FIG. 10A1, a component 1000, such as a semiconductor wafer, is provided, and in FIG. 10B1, a set of nanoparticles 1002 is positioned on the component 1000. FIGS. 10A2 and 10B2 depict top-down and bottom-up views of the structures of FIGS. 10A1 and 10B1, respectively. In FIG. 10C1, a set of nanowires 1004 is plated on the set of nanoparticles 1002. In some examples, a metal layer may be included between the component 1000 and the set of nanoparticles 1002, although in FIGS. 10A1-10H, such metal layers are excluded. FIG. 10C2 depicts a bottom-up view of the structure of FIG. 10C1. In FIG. 10D1, the component 1000, which may be a semiconductor wafer, is singulated into, e.g., a plurality of semiconductor dies 1000. FIG. 10D2 depicts a bottom-up view of the structure of FIG. 10D1. In FIG. 10E1, a component 1010, such as a lead frame die pad, is provided, and in FIG. 10F, one of the singulated components of FIG. 10D1 is positioned on the component 1010. FIG. 10E2 depicts a top-down view of the structure of FIG. 10E1. In FIG. 10G, pressure and/or temperature is applied to the component 1000, thereby causing the set of nanowires 1004 to melt and fuse to the component 1010 due to the appropriate combination of heat and pressure. In FIG. 10H, bond wires 1018 couple the component 1000 to leads 1011, while the component 1000 is attached to the component 1010 using nanowire-plated-nanoparticles. A mold compound 1020 covers the structure to form a semiconductor package. In FIGS. 10A1-10H, the sets of nanoparticles and sets of nanowires may have the same composition, size, shape, and/or fabrication as the sets of nanoparticles, and sets of nanowires described above.

Figure 11A:
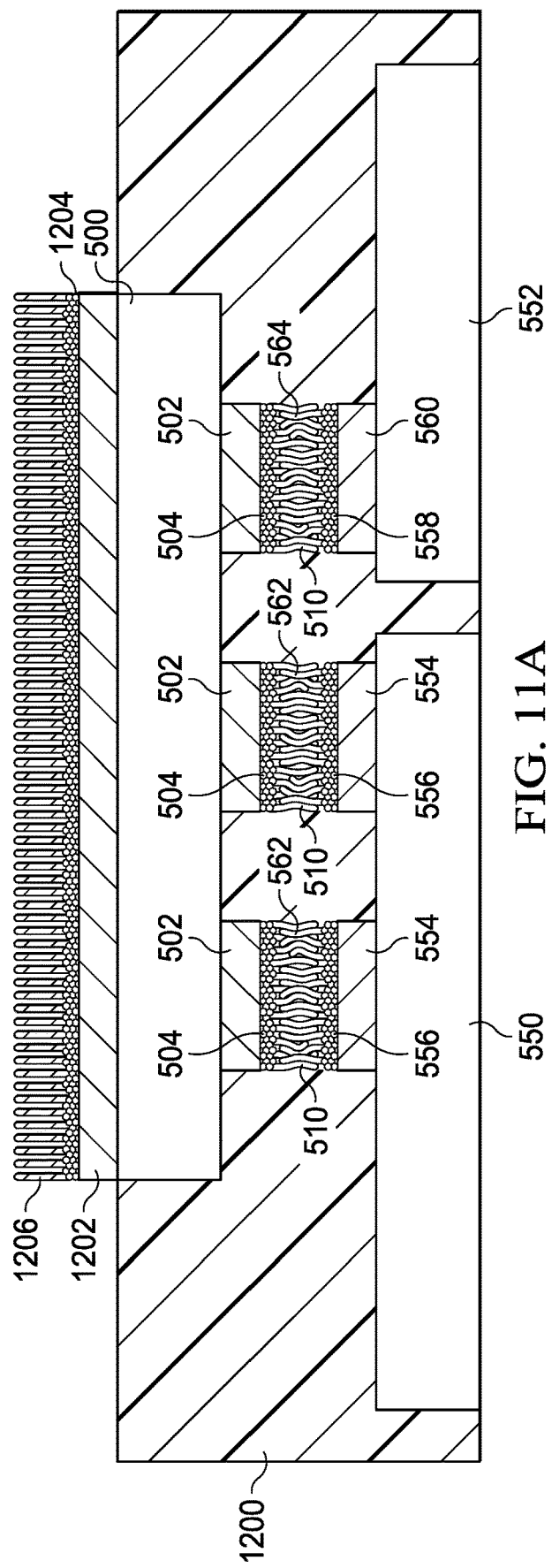
FIG. 11A depicts a semiconductor package having a heatsink comprising a set of nanowires plated on a set of nanoparticles, in accordance with various examples.
Figure 11B:
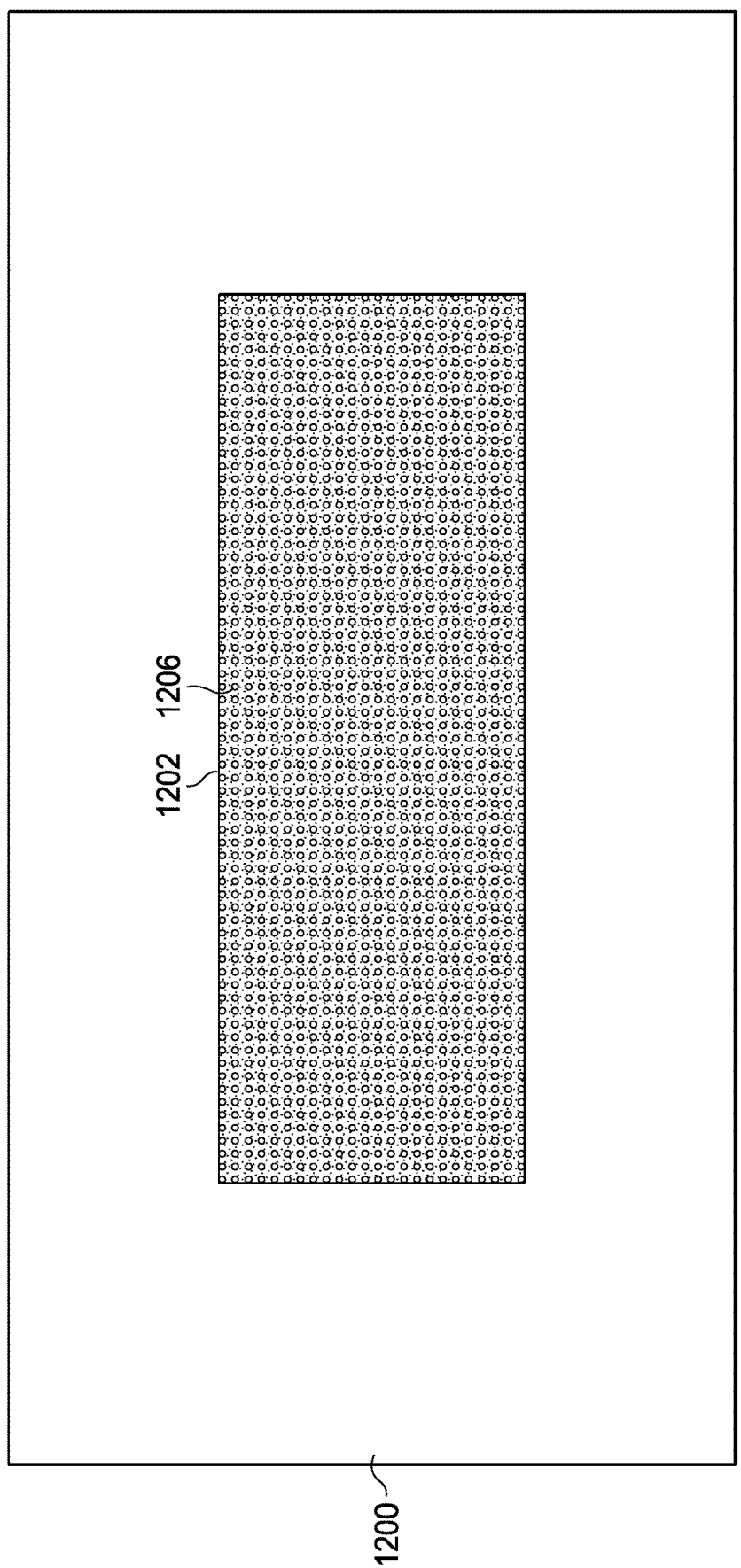
FIG. 11B depicts a top-down view of the semiconductor package of FIG. 11A, in accordance with various examples.

As explained above, nanowires are able to melt at low temperatures (e.g., room temperature) due to their high surface area-to-volume ratio. This degree of surface area exposure provides another benefit in the efficient release of heat. Accordingly, nanowires may be used as heat sinks in appropriate contexts. For example, FIG. 11A depicts a semiconductor package 1200 having a heatsink comprising a set of nanowires plated on a set of nanoparticles, in accordance with various examples. Specifically, package 1200 includes the structure of FIG. 4F, including the component (e.g., semiconductor die) 500, components 550, 552, metal layers 502, 554, 560, sets of nanoparticles 504, 556, 558, and sets of nanowires 562, 564, 510 coupled as shown and as described above with respect to FIG. 4F. The backside (non-active) surface of the component 500 is exposed to a top surface of the package 1200 such that the backside surface of the component 500 is not covered by a mold compound or epoxy. The component 500 has an optional metal layer 1202 coupled to it, and a set of nanoparticles 1204 is positioned on the metal layer 1202. A set of nanowires 1206 is plated on the set of nanoparticles 1204. Heat generated from within the package 1200, for example by the component 500, passes through the metal layer 1202, the set of nanoparticles 1204, and the set of nanowires 1206, being radiated away from the package 1200 by the set of nanowires 1206. In FIG. 11A, the metal layers, sets of nanoparticles and sets of nanowires may have the same composition, size, shape, and/or fabrication as the metal layers, sets of nanoparticles, and sets of nanowires described above. FIG. 11B depicts a top-down view of the structure of FIG. 11A.

Figure 12A:
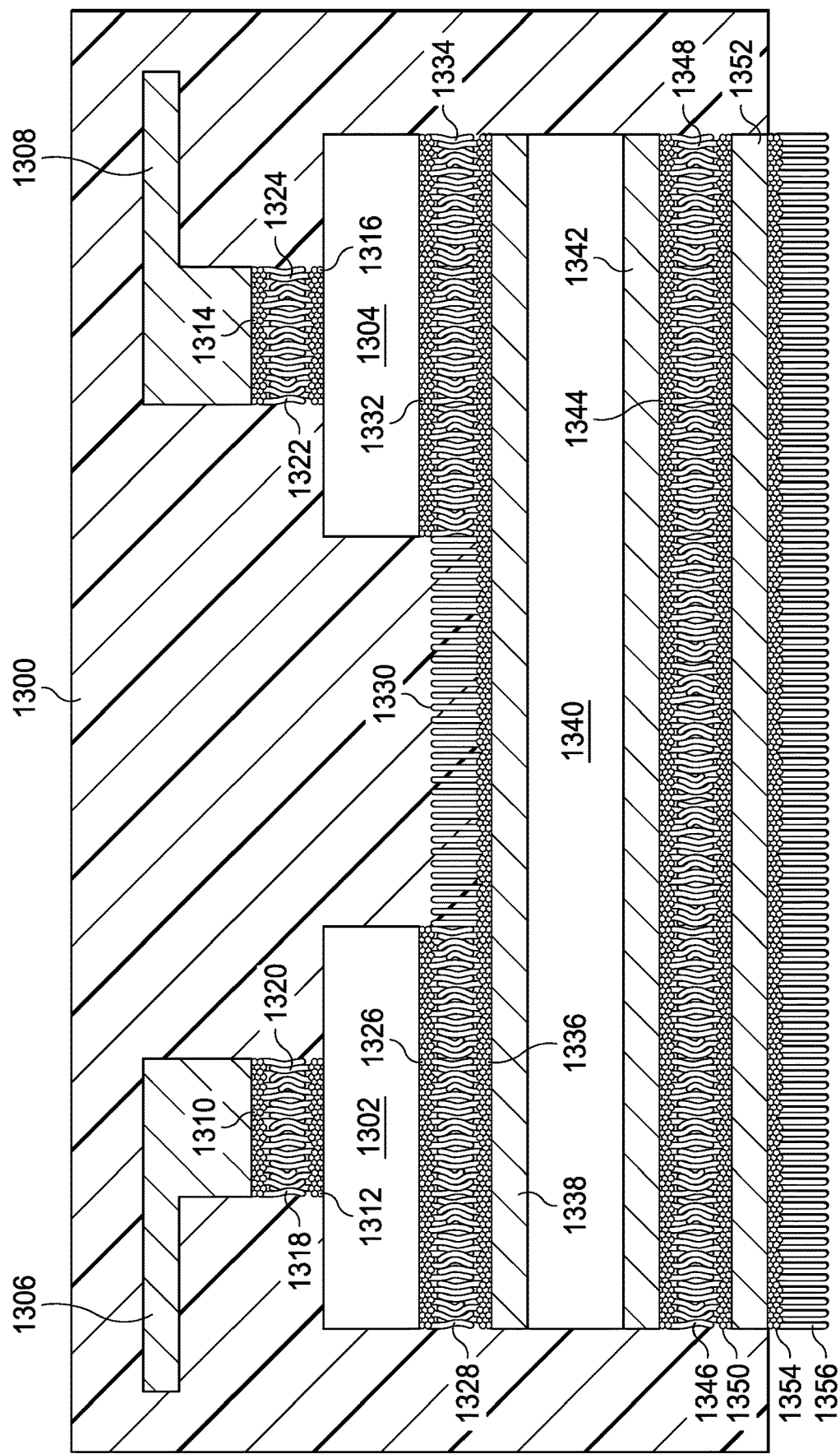
FIG. 12A depicts a semiconductor package comprising nanowires plated on nanoparticles as interconnects, in accordance with various examples.
Figure 12B:
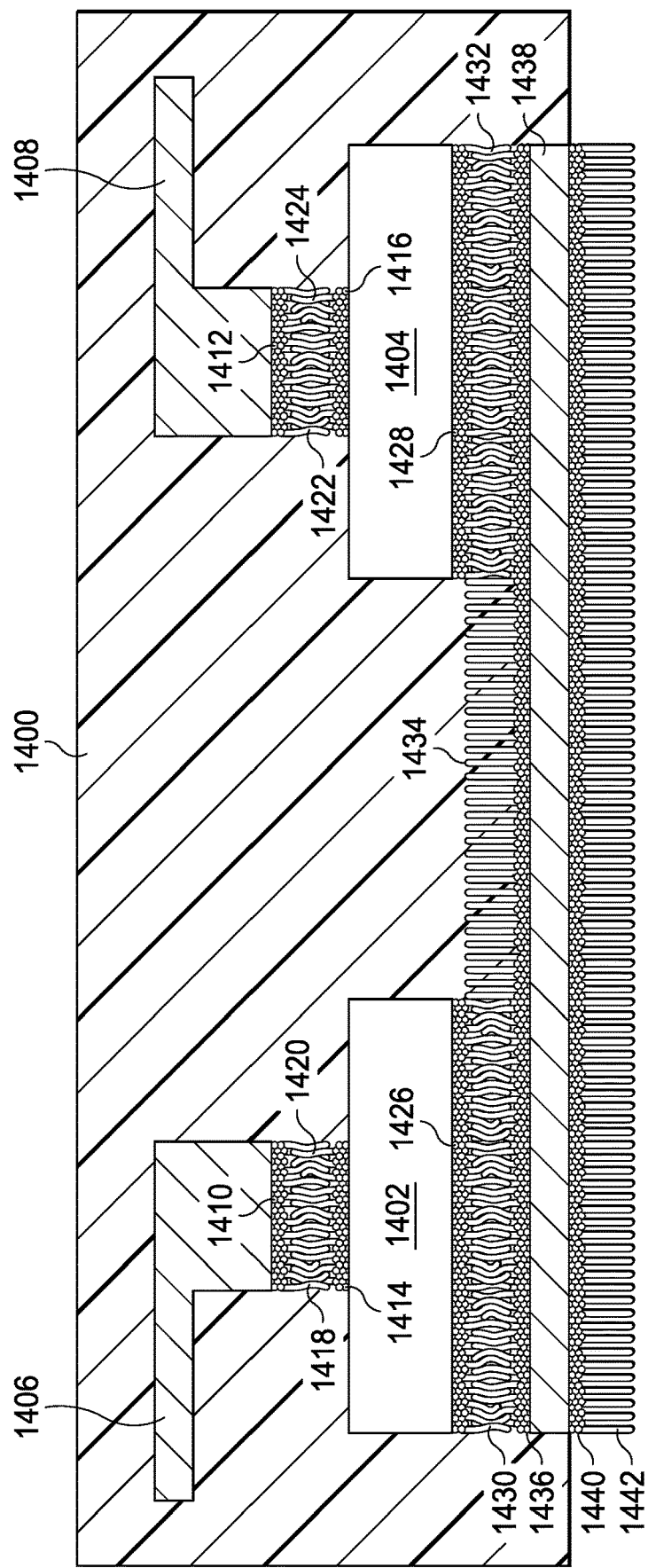
FIG. 12B depicts another semiconductor package comprising nanowires plated on nanoparticles as interconnects, in accordance with various examples.

The nanowire-plated-nanoparticle technology described herein efficiently conducts heat and electricity, making it suitable for applications in which improved heat dissipation is needed (e.g., as in FIGS. 11A and 11B) and/or in which wide temperature fluctuations have a deleterious impact on the mechanical integrity of a device. For example, wide temperature fluctuations can cause cracking and delamination of bond wire interconnect layers and/or of die attach layers and/or substrate bond layers, all of which are frequently solder-based layers. Accordingly, FIGS. 12A and 12B depict semiconductor packages comprising nanowire-plated-nanoparticles as interconnects that facilitate the coupling of bond wires, dies, and substrates. These nanowire-plated-nanoparticle interconnects promote the efficient elimination of heat from the package and, in addition, they resist cracking and delamination when subjected to wide temperature swings.

In FIG. 12A, a semiconductor package 1300 comprises a pair of semiconductor dies 1302, 1304, although any number of dies may be used. Busbars 1306, 1308 couple to the dies 1302, 1304, respectively, using nanowire-plated-nanoparticles. In particular, the busbar 1306 has a set of nanoparticles 1310 coupled thereto, with a set of nanowires 1318 plated to the set of nanoparticles 1310. The set of nanowires 1318 is fused to another set of nanowires 1320, which is plated on a set of nanoparticles 1312, which is positioned on a top surface of the die 1302. Similarly, busbar 1308 has a set of nanoparticles 1314 coupled thereto, with a set of nanowires 1322 plated to the set of nanoparticles 1314. The set of nanowires 1322 is fused to another set of nanowires 1324, which is plated to a set of nanoparticles 1316, which is positioned on a top surface of the die 1304. In addition, a set of nanoparticles 1326 is positioned on the die 1302, and a set of nanowires 1328 is plated on the set of nanoparticles 1326. Similarly, a set of nanoparticles 1332 is positioned on the die 1304, and a set of nanowires 1334 is plated on the set of nanoparticles 1332. The sets of nanowires 1328, 1334 are fused to a set of nanowires 1330, which are plated on a set of nanoparticles 1336, and the set of nanoparticles 1336 is positioned on a metal layer 1338. The metal layer 1338, in turn, is coupled to a substrate (e.g., a ceramic substrate) layer 1340.

Still referring to FIG. 12A, a metal layer 1342 couples to the substrate layer 1340, with a set of nanoparticles 1344 positioned on the metal layer 1342. A set of nanowires 1346 is plated on the set of nanoparticles 1344. The set of nanowires 1346 is fused to a set of nanowires 1348. The set of nanowires 1348 is plated on a set of nanoparticles 1350, which is positioned on a metal layer 1352. A set of nanoparticles 1354 is positioned on the metal layer 1352, and a set of nanowires 1356 is plated on the set of nanoparticles 1354. The set of nanowires 1356 is exposed to an exterior of the package 1300. The set of nanowires 1356 functions as a heat sink. In operation, data signals are provided to and from the dies 1302, 1304 via the busbars 1306, 1308. The busbars 1306, 1308 may couple to any other electronic device and, thus, the ends of the busbars 1306, 1308 opposite the dies 1302, 1304 are shown as being unconnected to another electronic device (agnostic to other possible electronic device connections). The structures between the dies 1302, 1304 and the set of nanowires 1356 transfer heat away from the dies 1302, 1304, with the set of nanowires 1356 radiating the heat away from the package 1300.

FIG. 12B depicts a structure that is similar to that of FIG. 12A, but without the substrate (e.g., ceramic) layer 1340 and the associated metal layers 1338, 1342, sets of nanoparticles 1336, 1344, and sets of nanowires 1330, 1346. In FIG. 12B, a semiconductor package 1400 comprises a pair of semiconductor dies 1402, 1404, although any number of dies may be used. Busbars 1406, 1408 couple to the dies 1402, 1404, respectively, using nanowire-plated-nanoparticles. In particular, the busbar 1406 has a set of nanoparticles 1410 coupled thereto, with a set of nanowires 1418 plated to the set of nanoparticles 1410. The set of nanowires 1418 is fused to another set of nanowires 1420, which is plated on a set of nanoparticles 1414, which is positioned on a top surface of the die 1402. Similarly, busbar 1408 has a set of nanoparticles 1412 coupled thereto, with a set of nanowires 1422 plated to the set of nanoparticles 1412. The set of nanowires 1422 is fused to another set of nanowires 1424, which is plated to a set of nanoparticles 1416, which is positioned on a top surface of the die 1404. In addition, a set of nanoparticles 1426 is positioned on the die 1402, and a set of nanowires 1430 is plated on the set of nanoparticles 1426. Similarly, a set of nanoparticles 1428 is positioned on the die 1404, and a set of nanowires 1432 is plated on the set of nanoparticles 1428. The sets of nanowires 1430, 1432 are fused to a set of nanowires 1434, which are plated on a set of nanoparticles 1436, and the set of nanoparticles 1436 is positioned on a metal layer 1438. The metal layer 1438, in turn, has a set of nanoparticles 1440 positioned thereupon, and a set of nanowires 1442 is plated on the set of nanoparticles 1440. The set of nanowires 1442 is exposed to an exterior of the package 1400 and functions as a heat sink.

In operation, data signals are provided to and from the dies 1402, 1404 via the busbars 1406, 1408. The busbars 1406, 1408 may couple to any other electronic device and, thus, the ends of the busbars 1406, 1408 opposite the dies 1402, 1404 are shown as being unconnected to (agnostic to) another electronic device. The structures between the dies 1402, 1404 and the set of nanowires 1442 transfer heat away from the dies 1402, 1404, with the set of nanowires 1442 radiating the heat away from the package 1400.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications. Unless otherwise stated, "about," "approximately," or "substantially" preceding a value means +/−10 percent of the stated value.

What is claimed is:

1. A method, comprising:
   forming a set of nanoparticles; and
   forming a set of nanowires extending from the set of nanoparticles.

2. The method of claim 1, wherein at least one nanowire of the set of nanowires has a length that is at least twice its diameter.

3. The method of claim 1, wherein at least one nanowire of the set of nanowires has a diameter of no more than 1 micron.

4. The method of claim 1, wherein at least one nanowire of the set of nanowires has a length of at least 2 microns.

5. The method of claim 1, wherein the nanoparticles are formed on a metal layer.

6. The method of claim 1, wherein the set of nanoparticles comprises titanium and wherein the set of nanowires comprises gold.

7. The method of claim 1, further comprising:
providing a first surface on which the set of nanoparticles is formed;
providing a second surface on which a second set of nanoparticles is formed;
forming a second set of nanowires extending from the second set of nanoparticles; and
coupling together the set of nanowires and the second set of nanowires.

8. The method of claim 1, further comprising providing a first surface on which the set of nanoparticles is disposed, wherein the set of nanowires couples to a second surface, and wherein the first and second surfaces are positioned within a package.

9. The method of claim 1, wherein the set of nanowires forms a heat sink coupled to a semiconductor die.

10. The method of claim 1, further comprising:
positioning the set of nanoparticles on a first surface of a die;
positioning a second set of nanoparticles on a busbar, extending a second set of nanowires from the second set of nanoparticles, the second set of nanowires fused to the set of nanowires;
coupling a substrate to a first metal layer, the first metal layer coupled to the die by way of a third set of nanowires; and
coupling a second metal layer to the substrate, the second metal layer coupled to a third metal layer by way of a fourth set of nanowires,
wherein the third metal layer comprises a fifth set of nanowires positioned external to a package housing the die, the first metal layer, and the second metal layer.

11. The method of claim 10, further comprising positioning a third set of nanoparticles on the die and a fourth set of nanoparticles positioned on the first metal layer, the third set of nanowires extending from the third set of nanoparticles and a sixth set of nanowires extending from the fourth set of nanoparticles, the third and sixth sets of nanowires fused to each other.

12. The method of claim 10, wherein the fifth set of nanowires and the fourth set of nanowires are positioned on opposing surfaces of the second metal layer.

13. The method of claim 10, wherein the substrate comprises a ceramic substrate.

14. A method, comprising:
providing a first surface;
coupling a first set of nanoparticles to the first surface;
extending a first set of nanowires from the first set of nanoparticles;
providing a second surface;
coupling a second set of nanoparticles to the second surface;
extending a second set of nanowires from the second set of nanoparticles; and
fusing the first and second sets of nanowires fused to each other.

15. The method of claim 14, wherein at least one of the first set of nanowires has length and diameter dimensions such that the at least one of the first set of nanowires has a melting point between 65 and 175 degrees Fahrenheit.

16. The method of claim 14, wherein the first surface comprises a metal layer.

17. The method of claim 14, wherein the first surface comprises a semiconductor.

18. The method of claim 14, wherein at least one nanowire of the first set of nanowires has a length that is at least twice its diameter.

19. The method of claim 14, wherein the first surface, the first set of nanoparticles, and the first set of nanowires are part of a semiconductor package, and wherein the second surface, the second set of nanoparticles, and the second set of nanowires are part of a printed circuit board (PCB).

20. The method of claim 14, wherein the first surface is a surface of a semiconductor die and the second surface is a surface of a portion of a lead frame, and wherein the first and second surfaces are positioned within a semiconductor package.

21. The method of claim 20, wherein the semiconductor die has a third surface opposite the first surface, a third set of nanoparticles positioned on the third surface, a third set of nanowires extending from the third set of nanoparticles, the third set of nanowires forming a heat sink exposed to an exterior of the semiconductor package.

22. The method of claim 14, wherein the first surface is that of a die, and the second surface is that of a busbar, the method further comprising:
coupling a metal layer to the die by way of a third set of nanowires, the metal layer having a fourth set of nanowires positioned external to a semiconductor package housing the die.

23. The method of claim 22, further comprising coupling a third set of nanoparticles to the die and coupling a fourth set of nanoparticles to the metal layer, the third set of nanowires coupling the third set of nanoparticles to the fourth set of nanoparticles.

24. The method of claim 23, further comprising coupling a fifth set of nanowires to the die, wherein the third set of nanowires couples to the metal layer, the third and fifth sets of nanowires fused to each other.

25. An apparatus, comprising:
a set of nanoparticles on a surface of a semiconductor device; and
a set of nanowires extending from the set of nanoparticles.

26. The apparatus of claim 25, wherein the surface comprises a metal layer.

27. The apparatus of claim 26, wherein the metal layer and the set of nanoparticles are composed of a same metal.

28. The apparatus of claim 26, wherein the metal layer and the set of nanoparticles are composed of different metals.

* * * * *